United States Patent
Wan

(10) Patent No.: US 8,902,005 B2
(45) Date of Patent: Dec. 2, 2014

(54) APPARATUS AND METHOD FOR WIDE COMMON MODE DIFFERENCE

(71) Applicant: Quan Wan, Belmont, MA (US)

(72) Inventor: Quan Wan, Belmont, MA (US)

(73) Assignee: Analog Devices, Inc., Norwood, MA (US)

( * ) Notice: Subject to any disclaimer, the term of this patent is extended or adjusted under 35 U.S.C. 154(b) by 115 days.

(21) Appl. No.: 13/626,512

(22) Filed: Sep. 25, 2012

(65) Prior Publication Data

US 2014/0084999 A1 Mar. 27, 2014

(51) Int. Cl.
*H03F 3/45* (2006.01)
(52) U.S. Cl.
CPC ........................................ *H03F 3/45* (2013.01)
USPC ............................ 330/258; 330/136; 330/297
(58) Field of Classification Search
CPC .................................................... H03F 1/0211
USPC .............................. 330/69, 127, 136, 297, 258
See application file for complete search history.

(56) References Cited

U.S. PATENT DOCUMENTS

| 6,956,727 | B1 | 10/2005 | Brokaw |
| 7,239,204 | B2 | 7/2007 | Gammie et al. |
| 7,821,333 | B2 * | 10/2010 | Yan et al. ........................ 330/9 |

OTHER PUBLICATIONS

Analog Devices, Inc., High Common-Mode Voltage, Difference Amplifier, AD629 Data Sheet, Apr. 2011, 16 pages.

* cited by examiner

*Primary Examiner* — Robert Pascal
*Assistant Examiner* — Khiem Nguyen
(74) *Attorney, Agent, or Firm* — Knobbe, Martens, Olson and Bear, LLP

(57) ABSTRACT

Apparatus and methods reduce increase the common mode range of a difference amplifier. A circuit uses one or more floating powers and one or more floating grounds coupled to an input stage of an amplifier to increase the common mode range of a difference amplifier. The floating power can be configured to select from the greater of the voltage level of one of the differential signals and the system power high source. The floating ground can be configured to select from the lesser of the voltage level of one of the differential signals and the system power low source.

26 Claims, 21 Drawing Sheets

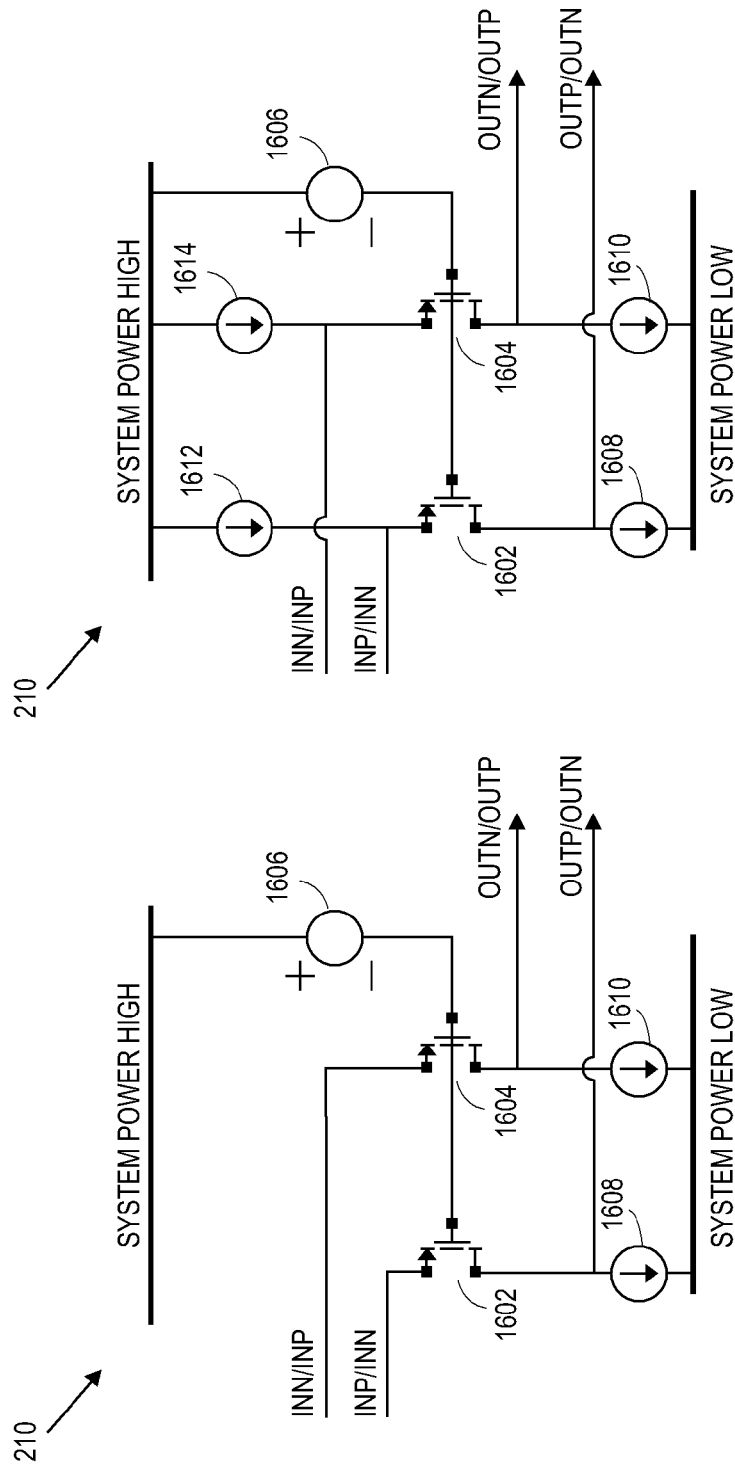

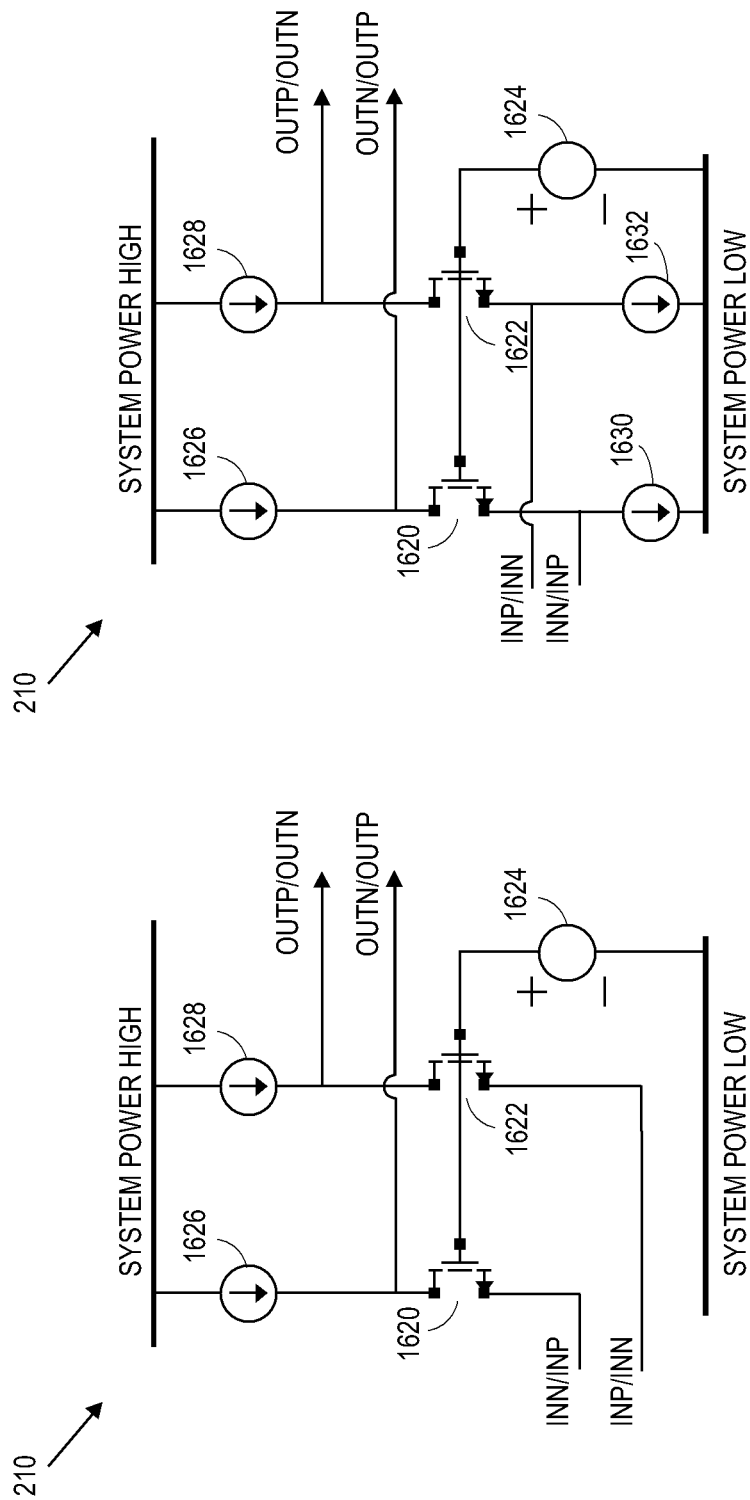

APPARATUS AND METHOD FOR WIDE COMMON MODE DIFFERENCE

BACKGROUND

1. Field

Embodiments of the disclosure relate to electronic devices, and more particularly, in one or more embodiments, to wide common mode difference amplifiers.

2. Description of the Related Technology

A difference amplifier is a special purpose amplifier designed to measure differential signals. One feature of a difference amplifier is its ability to remove unwanted common mode signals. Unlike most types of amplifiers, a difference amplifier is typically need to measure voltages beyond the supply rails, and is used in applications where large dc or ac common-mode voltages are present. It is ideal for current and voltage monitoring. For example, it can be used to amplify the voltage drop across a current shunt resistor, which is placed in series between power bus and some form of load. The amplifier performs current measurements across a shunt resistor in a variety of applications, such as, but not limited to digital audio, medical, automotive, telecommunications, or power management. To reduce power dissipation of the shunt resistor, it is desirable to keep the amount of resistance small. Therefore, the voltage drop across the resistor is usually small, for instance, hundreds of millivolts (mV) or less. However, the input common mode voltage can vary widely depending on applications. For example, to measure a load current for high-power class D amplifiers, the common mode voltage can be a sine wave with a peak-to-peak voltage of 300V, and frequency up to 20 kHz; in an ultrasound imaging system, the input common mode voltage can be about −120V; in telecommunication systems, the input common-mode can be −48V or +48V; and in automotive applications, the input common mode can be a pulse-width modulated signal varying between −2V to 65V at frequencies up to 20 kHz and duty cycles varying from 2% to 98%. Therefore, there is a need for a universal difference amplifier to handle such a wide common mode input range in order for operations in a variety of applications.

A conventional solution for AC current sensing uses resistor dividers in an input stage of a difference amplifier that is powered by a dedicated dual power supply. The resistor divider is configured such that it attenuates the input common mode voltage into an input range that can be handled by an input amplifier, such as the dual power supply range. However, there are several drawbacks with this approach. For instance, a dual power supply is required. The resistor divider increases the input referred noise, offset, and offset drift, and reduces the bandwidth of an amplifier.

SUMMARY

An electrical circuit or apparatus is described that includes a voltage selector circuit configured to receive a first supply voltage and a voltage selector input signal and further configured to generate a first internal rail voltage based on the lesser of the first supply voltage and the voltage selector input signal, wherein the voltage selector input signal comprises at least one of a non-inverted signal and an inverted input signal of an input signal. The apparatus also includes an input amplifier circuit configured to receive the input signal and output a voltage level shifted signal of the input signal based at least on the first supply voltage, at least a portion of the input amplifier circuit being coupled to the first internal rail voltage.

In some embodiments, the electrical circuit further includes an output amplifier coupled to the input amplifier circuit and configured to receive the voltage level shifted signal and output an output voltage. In some embodiments, the voltage selector circuit is further configured to receive a second supply voltage and generate a second internal rail voltage based on the greater of the second supply voltage and the voltage selector input signal.

In certain embodiments of the apparatus, the first supply voltage is ground and the second supply voltage is a DC power supply. In some embodiments of the apparatus, the voltage selector input signal comprises only one of the inverted signal and the non-inverted signal of the input signal. In certain embodiments, the voltage selector input signal comprises the lesser of the non-inverted signal and the inverted signal of the input signal. In some embodiments, the voltage selector input signal comprises the greater of the non-inverted signal and the inverted signal of the input signal. In certain embodiments of the apparatus, the voltage selector input signal comprises a combination of the inverted signal and the non-inverted signal of the input signal. In some embodiments of the apparatus, the voltage selector input signal is a common mode voltage of the input signal.

In some embodiments of the aforementioned apparatus, the input amplifier circuit includes a voltage-to-current converter, a current transfer block, and a current-to-voltage converter. The voltage-to-current converter can be configured to receive the input signal and convert differential input signal to one or more current signals and reject the common mode input signal. Further, the voltage-to-current converter can be coupled to the first internal rail voltage and the second internal rail voltage. The current transfer block can include one or more current mirrors and be configured to receive one or more current signals from the voltage-to-current converter. Furthermore, the current transfer block can be coupled to the first internal rail voltage and the second internal rail voltage. The current-to-voltage converter can be configured to receive the one or more current signals from the current transfer block and convert the one or more current signals to a second signal different from the input signal. Further, the current-to-voltage converter can be coupled to the first supply voltage and the second supply voltage.

In some embodiments of the aforementioned apparatus, the voltage selector circuit can include a first diode electrically coupled with the first internal rail voltage and the voltage selector input signal, a second diode electrically coupled with the first internal rail voltage and the first supply voltage, a third diode electrically coupled with the second supply voltage and the second internal rail voltage, and a fourth diode electrically coupled with the voltage selector input signal and the second internal rail voltage.

In certain embodiments of the aforementioned apparatus, the voltage selector circuit can include a first comparator that compares a voltage level of the voltage selector input signal with a voltage level of the first supply voltage, and a second comparator that compares the voltage level of the voltage selector input signal with a voltage level of the second supply voltage.

In certain embodiments, the voltage selector circuit is further configured to receive a second supply voltage and generate a second internal rail voltage and a third internal rail voltage. In some embodiments, the second internal rail voltage and the third internal rail voltage are based on a voltage level of the voltage selector input signal. Further, the third internal rail voltage maintains a relatively constant voltage difference from the second internal rail voltage, and at least a first portion of the input amplifier circuit is coupled to the second internal rail voltage and the third internal rail voltage.

In some embodiments of the apparatus that include a third internal rail voltage, the input stage can include a voltage-to-current converter, a current transfer block, and a current-to-voltage converter. In certain embodiments, the voltage-to-current converter can be configured to receive the input signal and convert the differential input signal to one or more current signals and reject the common mode input signal. Furthermore, the voltage-to-current converter can be coupled to the second internal rail voltage and the third internal rail voltage. In some embodiments, the voltage-to-current converter can be configured to receive the input signal and convert the differential input signal to one or more current signals and reject the common mode input signal. Furthermore, the voltage-to-current converter can be coupled to the second internal rail voltage and the third internal rail voltage. In certain embodiments, the voltage-to-current converter can be configured to receive the input signal and convert the differential input signal to one or more current signals and reject the common mode input signal, wherein the voltage-to-current converter is coupled to the second internal rail voltage and the third internal rail voltage.

In certain embodiments of the apparatus that include a third internal rail voltage, the voltage selector circuit can include a first diode electrically coupled with the first internal rail voltage and the voltage selector input signal, a second diode electrically coupled with the first internal rail voltage and the first supply voltage, a third diode electrically coupled with the second supply voltage and the second internal rail voltage, a fourth diode electrically coupled with the voltage selector input signal and the second internal rail voltage, a fifth diode electrically coupled with the third internal rail voltage and the voltage selector input signal, a sixth diode electrically coupled with the third internal rail voltage and the first supply voltage, and a clamping diode electrically coupled with the third internal rail voltage and the second internal rail voltage. In some embodiments, the clamping diode can be replaced with other type of clamping circuit or a voltage regulator.

In some embodiments, a method is provided for providing power to an input stage. In certain embodiments, the method can include receiving a first supply voltage, receiving a voltage selector input signal, wherein the voltage selector input signal comprises at least one of a non-inverted signal and an inverted signal of a input signal, and dynamically selecting the lesser of the first supply voltage and a voltage level of the voltage selector input signal as an internal rail voltage for an input stage of an operational amplifier circuit.

In certain embodiments, the method further includes receiving a second supply voltage, dynamically selecting the greater of the second supply voltage and a voltage level of the voltage selector input signal as a second internal rail voltage for the input stage of the operational amplifier circuit.

In certain embodiments, an apparatus is described that includes a voltage selector circuit and an input amplifier circuit. The voltage selector circuit can be configured to receive a supply voltage and a voltage selector input signal and further configured to generate an internal rail voltage based on the greater of the second supply voltage and the voltage selector input signal. Further, the voltage selector input signal can include only one of a non-inverted signal and an inverted signal of an input signal.

In some embodiments, the supply voltage is a second supply voltage; the internal rail voltage is a second internal rail voltage; and the voltage selector circuit can be further configured to receive a first supply voltage, and to generate a first internal rail voltage based on the lesser of the first supply voltage and the voltage selector input signal. Further, at least a portion of the input amplifier circuit can be coupled to the first internal rail voltage.

In certain embodiments of the apparatus, the first supply voltage is ground and the second supply voltage is a DC power supply. In some embodiments, the voltage selector input signal comprises the greater of the non-inverted signal and the inverted signal of the input signal. In certain embodiments, the voltage selector input signal includes the lesser of the non-inverted signal and the inverted signal of the input signal.

In some embodiments of the aforementioned apparatus, the input amplifier circuit includes a voltage-to-current converter, a current transfer block, and a current-to-voltage converter. The voltage-to-current converter can be configured to receive the input signal and convert the differential input signal to one or more current signals and reject the common mode input signal. Further, the voltage-to-current converter can be coupled to the first internal rail voltage and the second internal rail voltage. The current transfer block can include one or more current mirrors and be configured to receive one or more current signals from the voltage-to-current converter. Furthermore, the current transfer block can be coupled to the first internal rail voltage and the second internal rail voltage. The current-to-voltage converter can be configured to receive the one or more current signals from the current transfer block and convert the one or more current signals to a second signal different from the first input signal. Further, the current-to-voltage converter can be coupled to the first supply voltage and the second supply ground.

In some embodiments of the aforementioned apparatus, the voltage selector circuit can include a first diode electrically coupled with the first internal rail voltage and the voltage selector input signal, a second diode electrically coupled with the first internal rail voltage and the first supply voltage, a third diode electrically coupled with the second supply voltage and the second internal rail voltage, and a fourth diode electrically coupled with the voltage selector input signal and the second internal rail voltage.

In certain embodiments of the aforementioned apparatus, the voltage selector circuit can include a first comparator that compares a voltage level of the voltage selector input signal with a voltage level of the first supply voltage, and a second comparator that compares the voltage level of the voltage selector input signal with a voltage level of the second supply voltage.

In some embodiments, the supply voltage is a second supply voltage the internal rail voltage is a second internal rail voltage, and the voltage selector circuit can be further configured to receive a first supply voltage, and to generate a first internal rail voltage and a third internal rail voltage. The second internal rail voltage and the third internal rail voltage can be based on a voltage level of the voltage selector input signal. Further the third internal rail voltage can maintain a relatively constant voltage difference from the second internal rail voltage. In addition, at least a first portion of the input amplifier circuit can be coupled to the second internal rail voltage and the third internal rail voltage.

In some embodiments of the apparatus that includes a third internal rail voltage, the input stage can include a voltage-to-current converter, a current transfer block, and a current-to-voltage converter. In certain embodiments of the apparatus, the voltage-to-current converter can be configured to receive the input signal and convert the differential input signal to one or more current signals and reject the common mode input signal. Furthermore, the voltage-to-current converter can be coupled to the first internal rail voltage and the third internal rail voltage. In some embodiments of the apparatus, the current transfer block can include one or more current mirrors and be configured to receive the one or more current signals from the voltage-to-current converter. Further, the current transfer block can be coupled to the first internal rail voltage and the second internal rail voltage. In certain embodiments of the apparatus, the current-to-voltage converter can be configured to receive the one or more current signals from the current transfer block and convert the one or more current signals to a second input signal. Further, the current-to-voltage converter can be coupled to the first supply voltage and the second supply voltage.

In certain embodiments of the apparatus that include a third internal rail voltage, the voltage selector circuit can include a first diode electrically coupled with the first internal rail voltage and the first supply voltage, a second diode electrically coupled with the first internal rail voltage and the voltage selector input signal, a third diode electrically coupled with the second supply voltage and the second internal rail voltage, a fourth diode electrically coupled with voltage selector input signal and the second internal rail voltage, a fifth diode electrically coupled with the second supply voltage and the third internal rail voltage, a sixth diode electrically coupled with voltage selector input signal and the third internal rail voltage, and a clamping diode electrically coupled with the first internal rail voltage and the third internal rail voltage. In some embodiments, the clamping diode can be replaced with other type of clamping circuit or a voltage regulator.

In some embodiments, a method is provided for providing power to an input stage. In certain embodiments, the method includes receiving a supply voltage, receiving a voltage selector input signal. In some embodiments, the voltage selector input signal includes only one of a non-inverted signal and an inverted signal of an input signal. The method further includes dynamically selecting the greater of the supply voltage and a voltage level of the voltage selector input signal as an internal rail voltage for an input stage of an operational amplifier circuit.

In some embodiments, the supply voltage is a second supply voltage, the internal rail voltage is a second internal rail voltage, and the method further includes receiving a first supply voltage, and dynamically selecting the lesser of the first supply voltage and a voltage level of the voltage selector input signal as a first internal rail voltage for the input stage of the operational amplifier circuit.

An apparatus is described that includes a voltage selector circuit configured to receive a first supply voltage, a second supply voltage, and a voltage selector input signal. Based on the first supply voltage, a second supply voltage, and/or voltage selector input signal, the voltage selector circuit generates multiple internal rail voltages, which are coupled with an input amplifier circuit (multiple embodiments of which are described above and below). In some embodiments, the multiple internal rail voltages include at least two floating grounds and a floating power. In certain embodiments, the multiple internal rail voltages include at least two floating powers and a floating ground.

BRIEF DESCRIPTION OF THE DRAWINGS

FIGS. 16A, 16B, 16C, and 16D are circuit diagrams illustrating embodiments of a current-to-voltage converter.

DETAILED DESCRIPTION

Figure 1A:
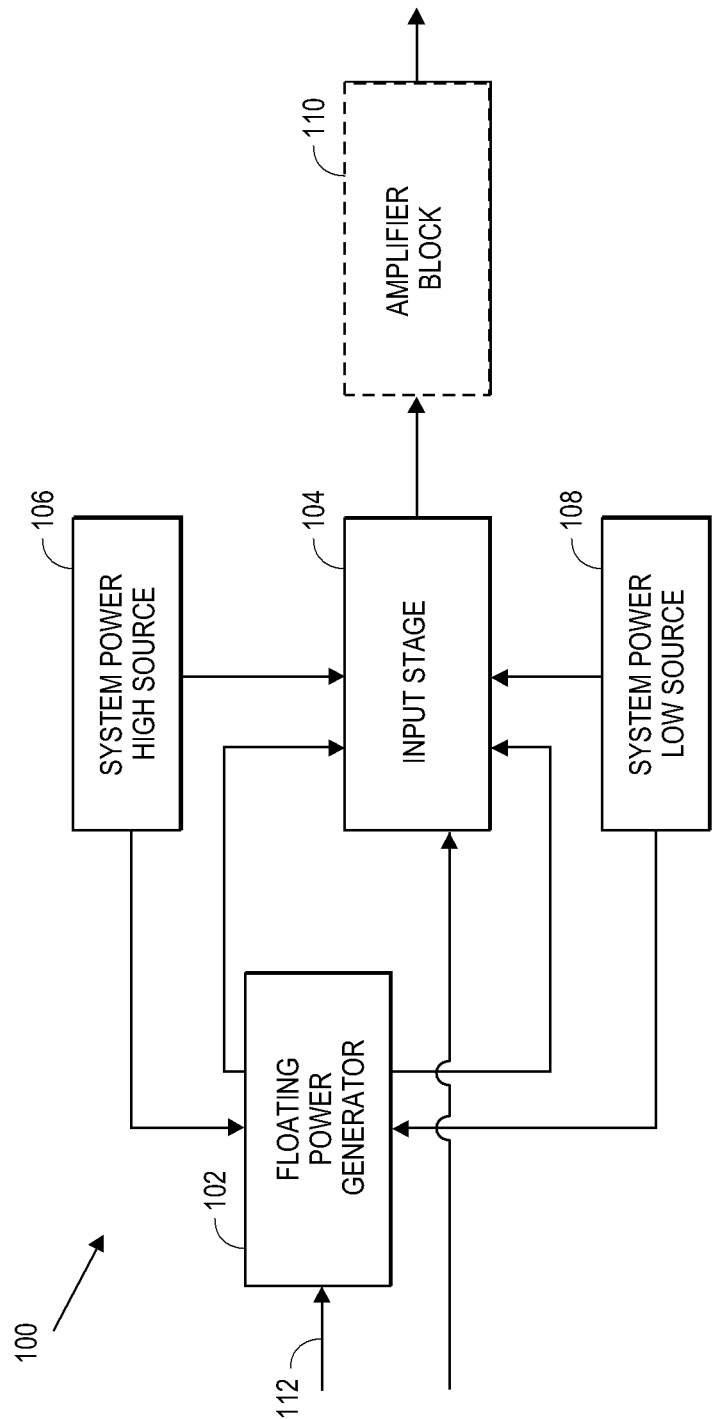
FIG. 1A is a schematic block diagram of one embodiment of a system for measuring and processing a wide common-mode range with a floating ground.

The following detailed description of certain embodiments presents various descriptions of specific embodiments of the disclosure. However, the other embodiments of the disclosure can be implemented in a multitude of different ways as defined and covered by the claims. In this description, reference is made to the drawings where like reference numerals indicate similar elements.

FIG. 1A is a schematic block diagram of an embodiment of a system for measuring a differential input signal and reject a common mode input signal. The system 100 can include a floating power generator 102, an input stage 104, a system power high source 106, a system power low source 108, and an optional amplifier block 110. The system 100 can reject a wide range of common mode input signals and amplify the differential input signal. An input common mode voltage Vcm can be defined as Vcm=(INP+INN)/2 and a differential input voltage Vid can be defined as Vid=(INP−INN), where INP and INN are the non-inverting and inverting signals of an input signal, respectively. Throughout the description, reference is made to INP and INN, which can refer to the non-inverting and inverting signals of an input signal, the non-inverting and inverting signals of the system, and/or the non-inverting and inverting signals in a particular component, or block, of the system.

The floating power generator 102 can receive as inputs: a voltage selector input signal 112 from the input signal, a voltage from the system power high source 106, and a voltage from the system power low source 108. The floating power generator 102 can generate as outputs one or more floating powers and one or more floating grounds coupled with the input stage 104. The floating power(s) and floating ground(s) are also referred to herein as internal rail voltages, and the floating power generator can also be referred to as a voltage selector circuit.

The floating power generator 102 can generate one or more floating powers based on the voltage selector input signal 112 from the input signal and/or the voltage level of the system power high source 106. The input signal can have a common mode voltage in a DC type of waveform, AC type of waveform or a switching type of waveform in addition to having a differential input voltage signal. However, due to voltage selection circuitry, either the system power high source or the input voltage signal, whichever is appropriate, can be selected for powering the input stage.

Similarly, the floating power generator 102 can generate one or more floating grounds based on the voltage selector input signal 112 and/or the voltage level of the system power low source 108. In some embodiments, the floating power generator 102 uses only one of the non-inverted signal or inverted signal from the input signal as the voltage selector input signal 112 to generate the floating power(s) and/or floating ground(s). For example, only one of the inverted or non-inverted signal can be coupled with the voltage selector input signal, or the floating power generator can select between the greater or lesser of the non-inverted signal or inverted signal. In certain embodiments, the floating power generator 102 uses a combination of the non-inverted signal or inverted signal from the input signal. For example, the input common mode voltage (or some other combination) can be used as the voltage selector input signal 112 to generate the floating power(s) and/or floating ground(s).

As mentioned, the floating power generator 102 can generate the one or more floating powers and the one or more floating grounds based on the voltage selector input signal 112, the system power high source 106 and/or the system power low source 108. Thus, as the common mode voltage level of the input signal changes, the voltage level of the floating power(s) and/or the floating ground(s) can vary as well. In some embodiments the floating power generator 102 is configured to generate a floating power as approximately the greater of the voltage selector input signal 112 from the input signal and the system power high source 106. In certain embodiments, the floating power generator 102 is configured to generate a floating ground that is roughly equal to the lesser of the voltage selector input signal 112 and the system power low source 108.

In some embodiments, such as the embodiments described in greater detail below with reference to FIGS. 6-9, the floating power generator 102 is configured to generate at least two floating grounds and a floating power. For example, the floating power generator 102 can generate a floating power that tracks the voltage level of the voltage selector input signal 112, a first floating ground that is roughly equal to the lesser of the voltage selector input signal 112 and the system power low source 108, and a second floating ground that also tracks the voltage selector input signal 112 and maintains a relatively constant difference from the floating power.

In certain embodiments, such as the embodiments described in greater detail below with reference to FIGS. 10-13, the floating power generator 102 can generate at least two floating powers and a floating ground. For example, the floating power generator 102 can generate a first floating power that is roughly equal to the greater of the voltage level of the voltage selector input signal 112 and the system power high source 106, a second floating power that tracks the voltage level of the voltage selector input signal 112, and a floating ground that also tracks the voltage selector input signal 112 and maintains a relatively constant difference from the second floating power.

As will be described in greater detail below with reference to FIGS. 2, 6, and 10, the floating power(s) and floating ground(s) generated by the floating power generator 102 can be coupled with one or more components of the input stage 104. The input stage 104 can also be referred to as an input amplifier circuit. Furthermore, it will be understood that the floating power generator 102 can be configured to generate fewer or more floating powers and/or floating grounds as desired.

The floating power generator 102 can be implemented using one or more diodes, clamping diodes, such as Zener diodes, etc., switches, comparators, BJTs, MOSFETs, etc. It will be understood that "MOSFETs" can have gates made out of material other than metals, such as from polycrystalline silicon, and can have dielectric "oxide" regions made from dielectrics other than silicon oxide, such as from silicon nitride or high-k dielectrics. Various embodiments of the floating power generator 102 will be described in greater detail with reference to FIGS. 4A, 4B, 8, and 12.

As will be described in greater detail with reference to FIGS. 2, 6, and 10, the input stage 104 is configured to receive both the non-inverted and inverted signals of the input signal, process the input signal and perform a voltage level shift of the input signal, and output the voltage level shifted signal. The voltage level shift to the input signal can be benefited from floating power(s) and floating ground(s). More specifically, in some embodiments, the input stage 104 can be used to help reject a wide range of (in some instances time-varying) common mode input voltage signal and amplify the differential input voltage signal. The input stage 104 can output an amplified differential voltage signal in addition to a relatively constant common mode voltage, which is compatible with the common mode input range of an optional buffer amplifier block 110, or any other circuit coupled to output of the input stage 104 such as data converters, filters, signal processors. To effectuate the voltage level shift, different components of the input stage 104 can be coupled with the floating power(s), the floating ground(s), the system power high source 106, and the system power low source 108.

The system power high source 106 and the system power low source 108 can be the system high voltage and the system low voltage provide for power to a chip, such as a chip including a difference amplifier. In certain embodiments, the system power high source 106 is a positive DC voltage and the system power low source 108 is ground.

The optional amplifier block 110 can be configured to receive the voltage shifted signals from the input stage 104 and amplify the difference based on the circuit configuration. In some embodiments, the amplifier block 110 can be powered by the system power high source 106, the system power low source 108, and/or the floating power(s) and the floating ground(s). In some embodiments, the amplifier block 110 can be used to drive heavy resistive and/or capacitive loads.

Figure 1B:
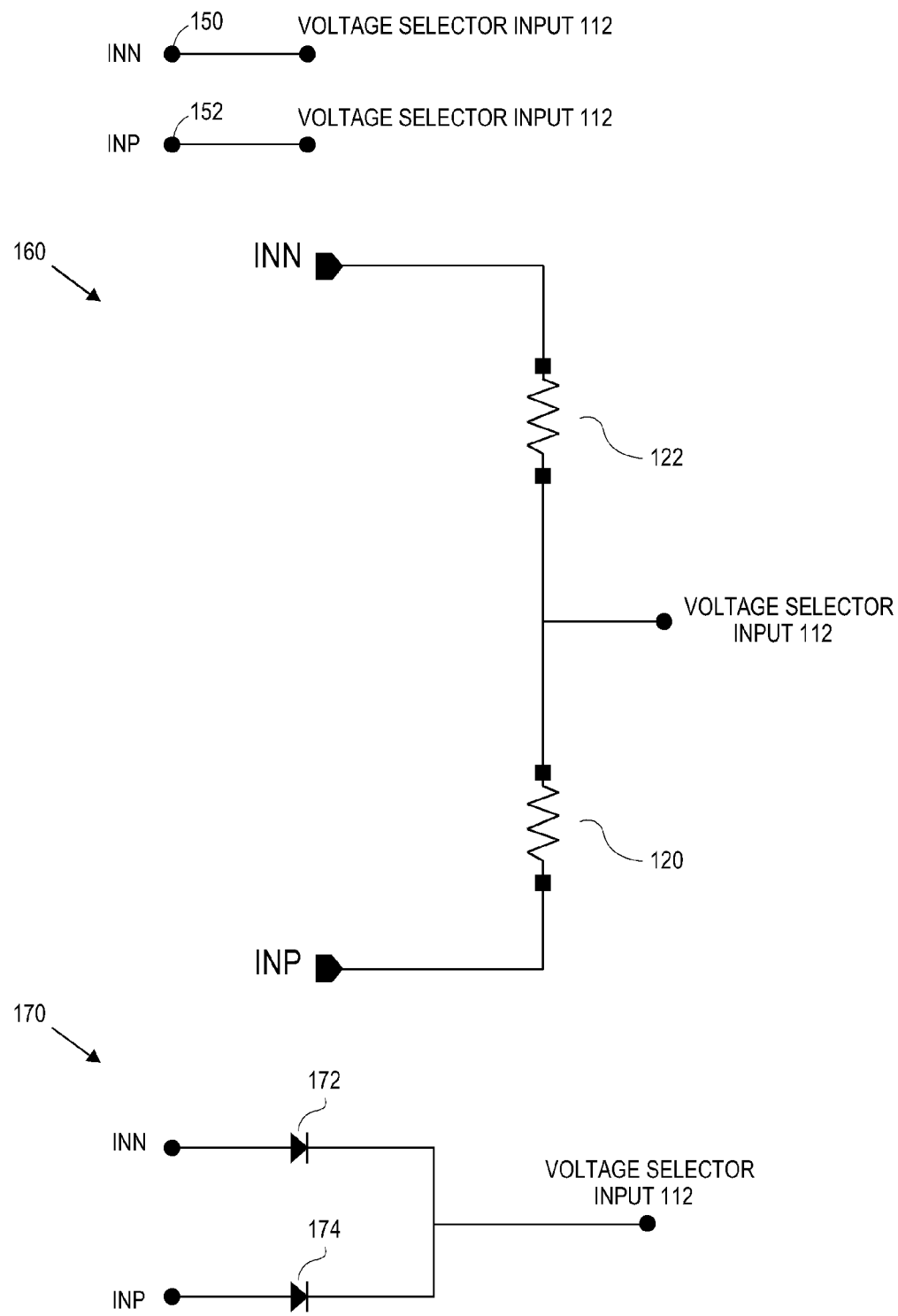
FIG. 1B is a circuit diagram illustrating an embodiment of a circuit for generating a common mode voltage.

FIG. 1B is a circuit diagram illustrating embodiments of circuits for generating the voltage selector input signal 112, which can be used by the floating power generator 102 to generate the floating power(s) and floating ground(s). As illustrated by input pins 150 and 152, in some embodiments, the voltage selector input signal 112 can be based on only one of the inverted signal INN or non-inverted signal INP of the input signal. For example, the voltage selector input signal 112 can be electrically coupled with only one of inverted signal INN or the non-inverted signal INP of the input signal.

Although not illustrated in FIG. 1B additional circuit components can be included, such as resistors, transistors, capacitors, inductors, etc.

Further, the voltage selector input signal 112 can be based on a selection between the inverted signal INN or non-inverted signal INP. For example, the signal with the greater voltage or lesser voltage can be selected as the voltage selector input signal. Circuit 170 is illustrative of an embodiment for generating the voltage selector input signal 112 based on the greater of the inverted signal INN and the non-inverted signal INP. As part of the circuit 170, a diode 172 can be electrically coupled with the inverted signal INN and the voltage selector input signal 112. The anode of the diode 172 can be electrically coupled with the inverted signal INN and the cathode of the diode 172 can be electrically coupled with the voltage selector input signal 112. A second diode 174 can be electrically coupled with the non-inverted signal INP and the voltage selector input signal 112, with the anode electrically coupled with the non-inverted signal INP and the cathode electrically coupled with the voltage selector input signal 112.

It will be understood that a variety of circuits can be used to implement various selections between the inverted signal INN and the non-inverted signal INP to generate the voltage selector input signal 112. For example, another circuit can be implemented such that the lesser of the inverted signal INN and the non-inverted signal INP is used as the voltage selector input signal 112, etc.

In certain embodiments, a combination of the inverted signal INN and the non-inverted signal INP of the input signal can be used as the voltage selector input signal 112. For example, the common mode voltage (or average voltage), the greater voltage, the lesser voltage or some other combination of the inverted signal INN and the non-inverted signal INP can be used as the voltage selector input signal 112.

Circuit 160 is illustrative of an embodiment for generating the voltage selector input signal 112 based on a combination of the inverted signal INN and the non-inverted signal INP of the input signal, such as the common mode voltage (or average voltage). To generate the common mode voltage of the input signal, a voltage averaging circuit can be used. For example, the resistor 120 can be electrically coupled with non-inverted signal INP of the input signal and the voltage selector input signal 112, and the resistor 122 can be electrically coupled with the inverted signal INN of the input signal and the voltage selector input signal 122. The resulting voltage between the two resistors can be used as the common mode voltage and as the voltage selector input signal 112. In some embodiments, the resistors 120 and 122 can have the same resistance; however, other configurations can be used.

It will be understood that a variety of circuits can be used to implement various combinations of the inverted signal INN and the non-inverted signal INP to generate the voltage selector input signal 112.

Figure 2:
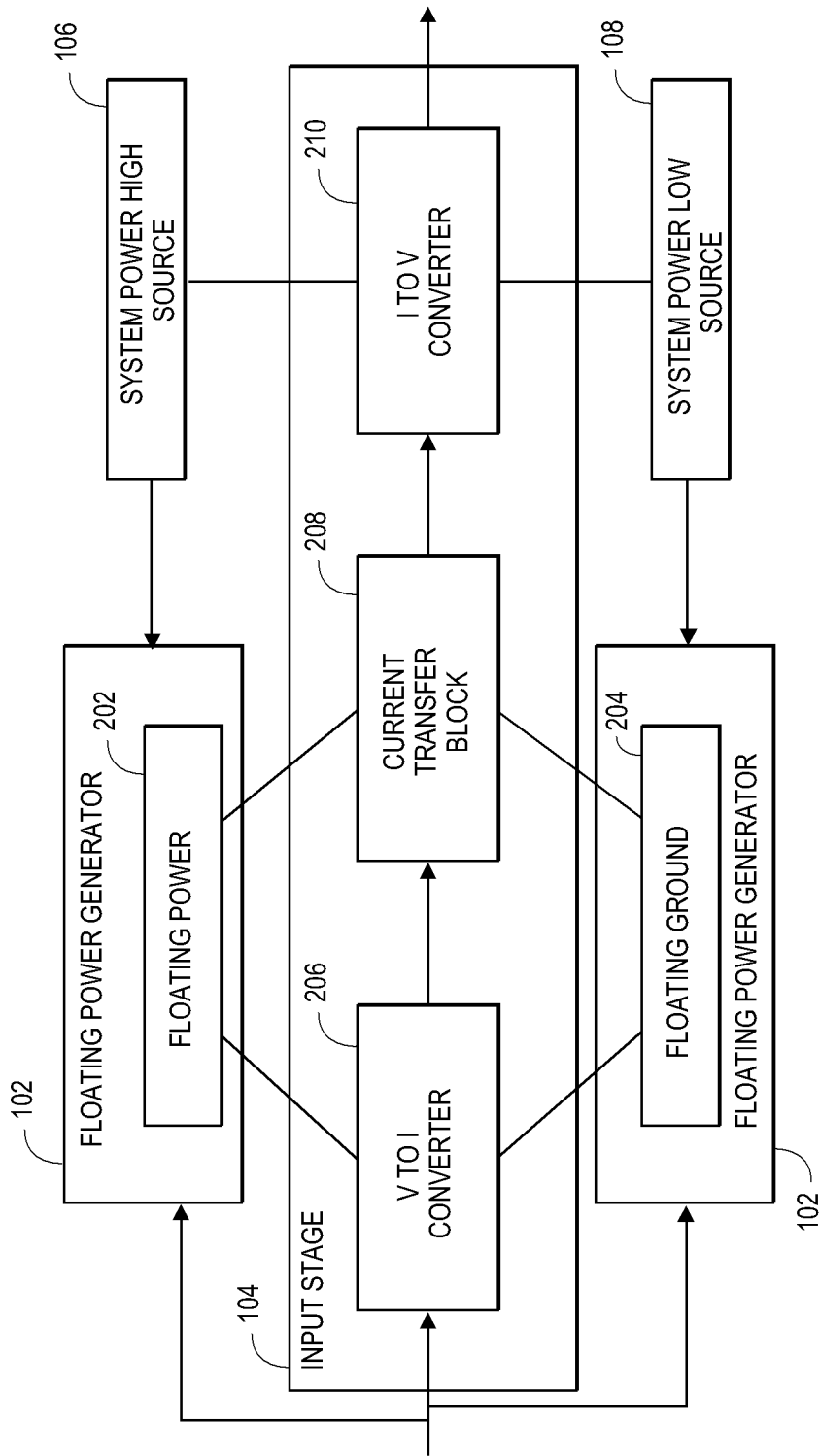
FIG. 2 is a schematic block diagram illustrating an input stage of the electronic system of FIG. 1A.

FIG. 2 is a schematic block diagram illustrating an embodiment of the components of the input stage 104 of the electronic system 100 of FIG. 1 coupled with a floating power 202 and a floating ground 204. As described in greater detail above with regards to FIG. 1, different components of the input stage 104 can be coupled with outputs from the floating power generator 102. For purposes of convenience, the floating power generator 102 illustrated in FIG. 2 has been divided into two parts. However, it will be understood that the floating power generator 102 can be implemented as a single circuit, or as multiple circuits, as desired.

The input stage 104 can include a voltage-to-current converter 206, a current transfer block 208, and a current-to-voltage converter 210. The voltage-to-current converter 206 can convert the input signal received at the input stage 104 into current signals. In some embodiments, the voltage-to-current converter 206 is coupled with a floating power 202 and a floating ground 204 to enable the voltage-to-current converter 206 to adapt to a wide range of (in some instances time varying) common mode voltages. In this manner, the voltage-to-current converter 206 can be properly powered and biased even though the input common mode voltage level may be much higher than the system power high or much lower than the system power low. As will be described in greater detail below with reference to FIGS. 14A-14C, the voltage-to-current converter 206 can be implemented using transistors (e.g., FETs, BJTs, etc.), current sources, etc.

The current transfer block 208 provides the current signals from the voltage-to-current converter 206 as an input to the current-to-voltage converter 210. The current transfer block 208 can act as a buffer between the incoming input signal and the internal circuit and/or system. Note the incoming input may contain an unwanted wide range time varying common mode signal in addition to a desired differential signal and the internal circuit and/or system usually have a fixed voltage range based on the system power high source and low source. In the illustrated embodiment, the current transfer block 208 is coupled with the floating power 202 and the floating ground 204. In this manner, the current transfer block 208 is properly powered and biased even though the input common mode voltage level may be much higher than the system power high or much lower than the system power low. Furthermore, by coupling the current transfer block with a floating power and/or a floating ground, a single power supply, or system power high source, can be used and can handle fully symmetrical common mode input (e.g. +/−300V, etc.) without attenuating the input signal. As will be described in greater detail below with reference to FIGS. 15A-15D, the current transfer block 208 can be implemented using transistors (e.g., FETs, BJTs, etc.). In some embodiments, the current transfer block 208 is implemented using one or more current mirrors.

In some embodiments, the current-to-voltage converter 210 can be the final stage of the input stage 104. The current-to-voltage converter 210 can convert the current signals received from the current transfer block 208 into voltage signals for the amplifier block (not shown) and/or the rest of the circuit. The current-to-voltage converter 210 can be coupled with the system power high source 106 and the system power low source 108 to enable the output voltage of the current-to-voltage converter 210 to be compatible with the system voltage or system power of the circuit. As will be described in greater detail below with reference to FIG. 8, the current-to-voltage converter can be implemented using transistors (e.g., FETs, BJTs, etc.), voltage sources, current sources, etc.

As described in greater detail above, the system power high source 106 and the system power low source 108 can be coupled with the floating power generator 102, and used by the floating power generator 102 to determine the voltage level of the floating power 202 and the floating ground 204. In addition, as mentioned above, the system power high source 106 and the system power low source 108 can be coupled to the current-to-voltage converter 210 to ensure that the signal at the output of the current-to-voltage converter 210 is compatible with the system voltage.

As mentioned, the floating power generator 102 can include a floating power 202 and a floating ground 204, which are coupled to the voltage-to-current converter 206 and the current transfer block 208 of the input stage 104. The floating power 202 and the floating ground 204 allow the voltage-tocurrent converter 206 and the current transfer block 208 to adapt to the voltage level of the incoming input signal. As mentioned previously, the floating power 202 and the floating ground 204 can vary based on the system power high source, the system power low source, and the voltage selector input signal 112 (e.g., one of the signals of the input signal or the input common mode voltage), when the voltage selector input signal 112 has a voltage that is outside of the system power high and/or the system power low. In the embodiment illustrated in FIG. 2, the floating power 202 is roughly equal to the greater of the voltage level of the voltage selector input signal 112 and the system power high source 106. Furthermore, in the illustrated embodiment, the floating ground 204 is roughly equal to the lesser of the voltage level of the voltage selector input signal 112 and the system power low source 108.

Figure 3:
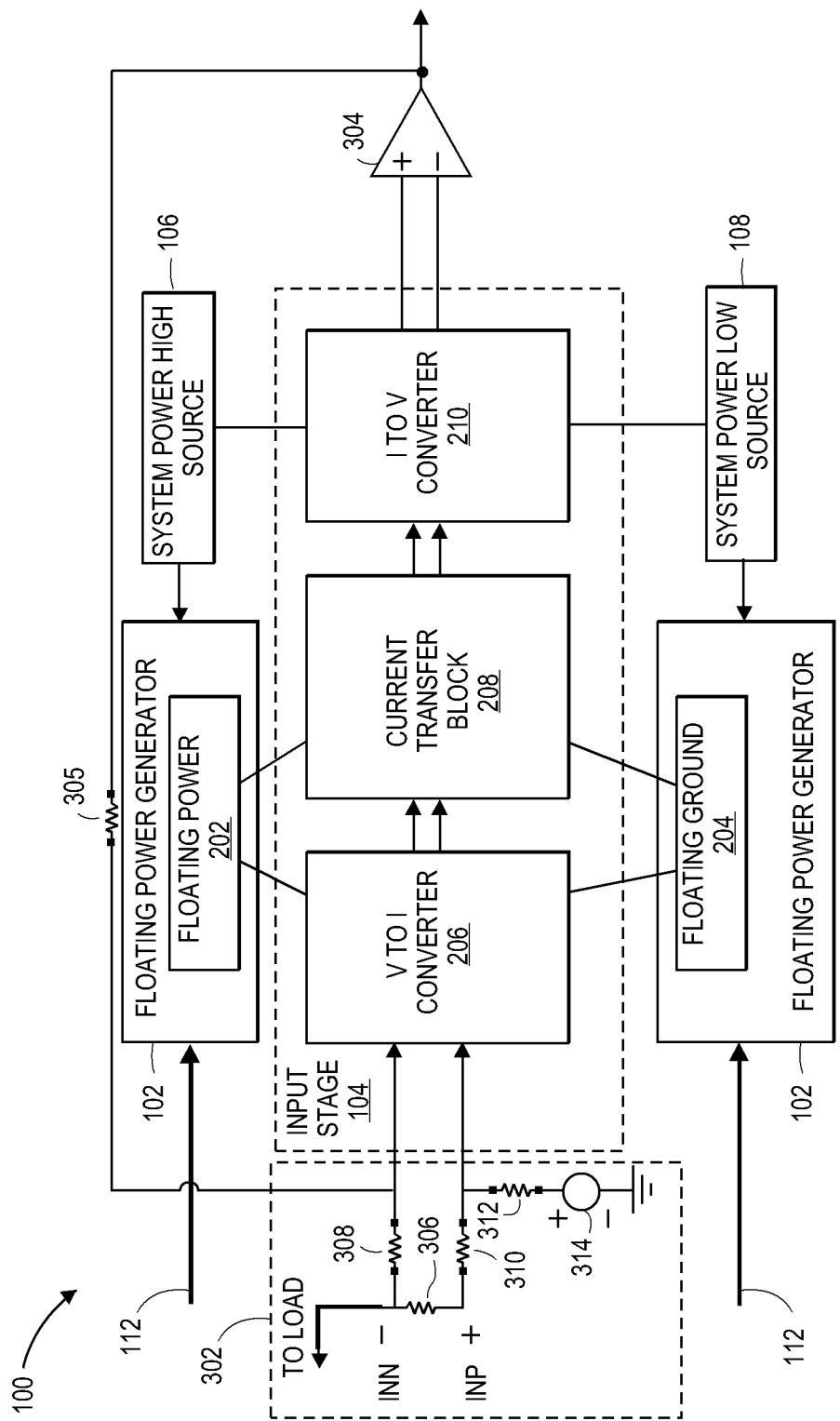
FIG. 3 is a block diagram illustrating an embodiment of wide common mode difference amplifier circuit.

FIG. 3 is a block diagram illustrating an embodiment of a wide common mode difference amplifier circuit 300. The circuit 300 includes the components shown in FIG. 2, as well as additional components. In addition to the floating power generator 102, the input stage 104, the system power high source 106, and the system power low source 108, the circuit 300 further includes input circuitry 302, an optional amplifier 304, and a feedback resistor 305. As illustrated, the input circuitry 302 can include the inverted and non-inverted signals of the input signal INN, INP, resistors 308, 310, 312, and a voltage bias 314. The gain of the system can be set by the shunt resistor 306, and/or the ratio of resistor 305 over resistor 308, and resistor 312 over resistor 306.

The signal path of the input signal will now be described in greater detail. An input signal having an inverted signal and a non-inverted signal (INN, INP) passes through the resistors 308, 310 and enters the voltage-to-current converter 206 at the input stage 104. The voltage-to-current converter 206, which is powered by a source having a voltage that is at least in the same range as the input signal due to the floating power 202 and floating ground 204, converts the input signal into two current signals and outputs the current signals to the current transfer block 208. The current transfer block, which also has a voltage level in the range of the input signal due to the floating power 202 and floating ground 204, provides the current signals as an input to the current-to-voltage converter 210. The current-to-voltage converter 210 converts the current signals to voltage signals based on the system power high source 106 and system power low source 108 to which it is coupled. In some embodiments, because the system power high source and low source are fixed and the floating power and ground 204 may vary with the input signals, the current transfer block can function as a bridge to couple the voltage-to-current converter 206 and current-to-voltage converter 210. The optional amplifier 304 can be used to amplify the difference between the inverted and non-inverted signals, or differential signal, of the voltage signals from the current-to-voltage converter 210 as desired.

Figure 4A:
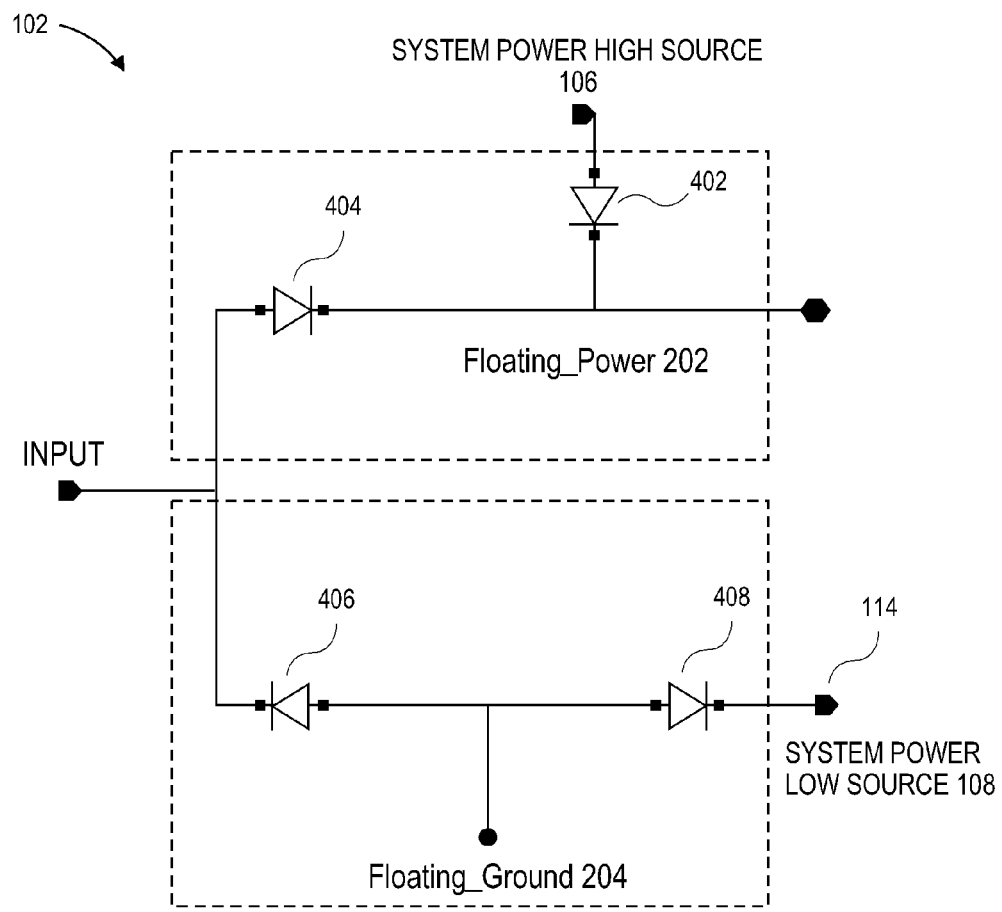
FIGS. 4A and 4B are circuit diagrams illustrating embodiments of a floating power generator.
Figure 4B:
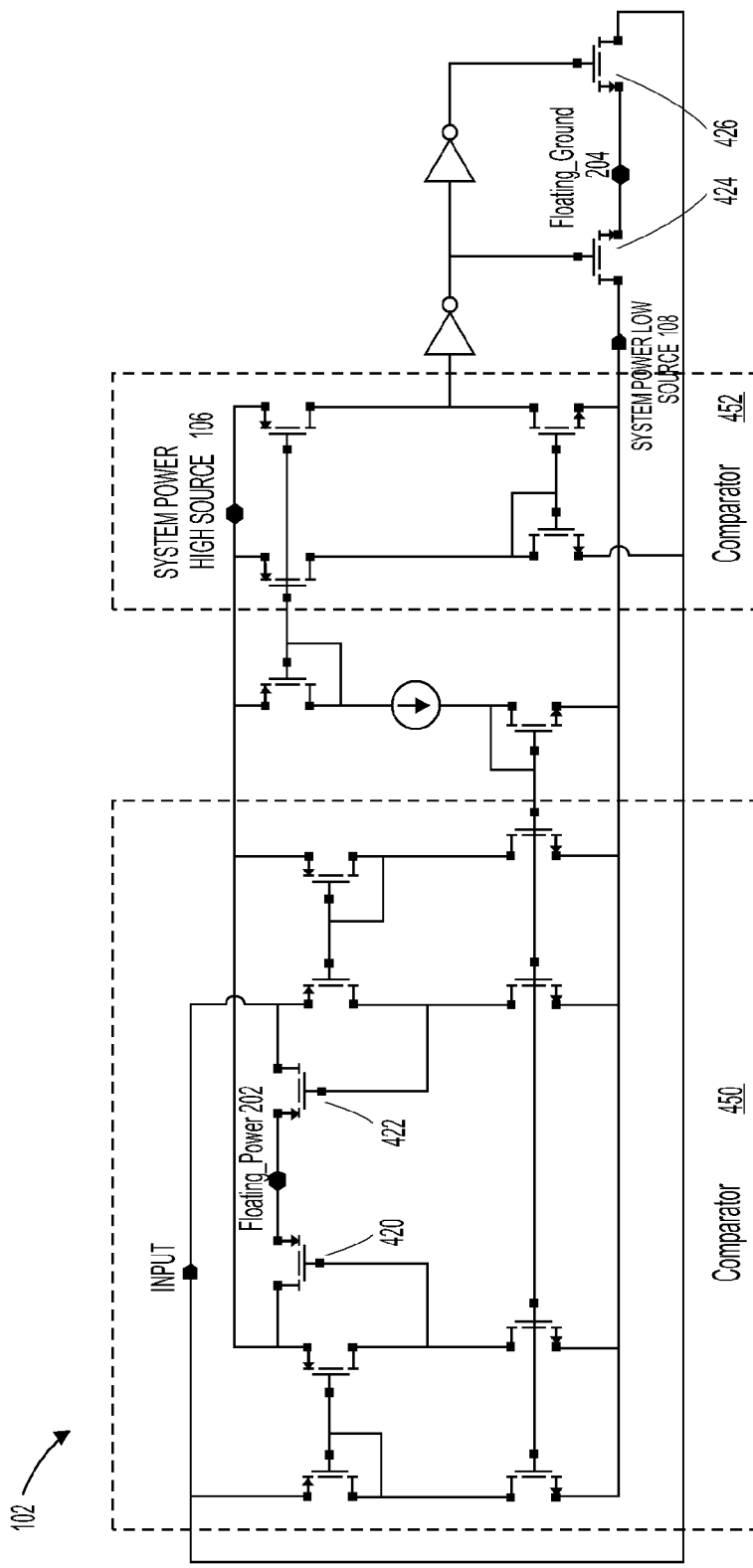

FIGS. 4A and 4B are circuit diagrams illustrating embodiments of the floating power generator 102. The illustrated embodiments can be used to generate a floating power voltage that is roughly equal to the greater of the voltage selector input signal 112 and the voltage of the system power high source 106, and to generate a floating ground that is roughly equal to the lesser of the voltage selector input signal 112 and the system power low source 108.

In the illustrated embodiment of FIG. 4A, the floating power generator 102 is implemented using multiple diodes 402, 404, 406, 408. In some embodiments, to generate the floating power 202, a first diode 402 is electrically coupled with the system power high source 106 and the floating power 202 (e.g., anode electrically coupled with system power high source 106 and cathode electrically coupled with the floating power 202), and a second diode 404 is electrically coupled with the voltage selector input signal 112 and the floating power 202 (e.g., anode electrically coupled with the voltage selector input signal 112 and cathode electrically coupled with the floating power 202). In this configuration, the floating power 202 can be roughly equal to the greater of the voltage selector input signal 112 and the voltage of the system power high source 106.

The floating power generator 102 can also generate the floating ground 204 based on the diodes 406 and 408. The diode 406 is electrically coupled with the floating ground 204 and the voltage selector input signal 112 (e.g., anode electrically coupled with the floating ground 204 and cathode electrically coupled with the voltage selector input signal 112), and the diode 408 is electrically coupled with the floating ground and the system power low source 108 (e.g., anode electrically coupled with the floating ground and cathode electrically coupled with the system power low source 108), which in some embodiments can also be the ground. In this configuration, the floating ground 204 can be roughly equal to the lesser of the voltage selector input signal 112 and the voltage of the system power low source 108.

FIG. 4B is a circuit diagram illustrative of another embodiment of the floating power generator 102, using comparators 450 and 452, current source(s), and inverters to implement the voltage selection. As illustrated, each of the comparators can be implemented using one or more switches, such as, but not limited to FETs, BJTs, etc. In this configuration, the floating power 202 can be roughly equal to the greater of the system power high source 106 and the voltage selector input signal 112, and the floating ground 204 can be roughly equal to the lesser of the voltage selector input signal 112 and the system power low source 108.

In the illustrated embodiment, the comparator 450 compares the voltages of the voltage selector input signal 112 and the system power high source 106. If the voltage selector input signal 112 is less than the voltage of the system power high source 106, the comparator actuates the switch 420 on, which connects the floating power 202 to the system power high source 106, and actuates the switch 422 off. If the voltage selector input signal 112 is greater than the voltage of the system power high source, the comparator actuates switch 422 on, which sets the floating power 202 roughly equal to the voltage selector input signal 112, and actuates the switch 420 off.

Similarly, the comparator 452 compares the voltages of the voltage selector input signal 112 and the system power low source 108. If the voltage selector input signal 112 is greater than the system power low source 108, the comparator actuates the switch 424 on, which connects the floating ground 204 to the system power low source 108, and actuates the switch 426 off. If the voltage selector input signal 112 is less than the system power low source 108, the comparator actuates the switch 426 on, which sets the floating ground 204 roughly equal to the voltage selector input signal 112, and actuates the switch 424 off.

Figure 5:
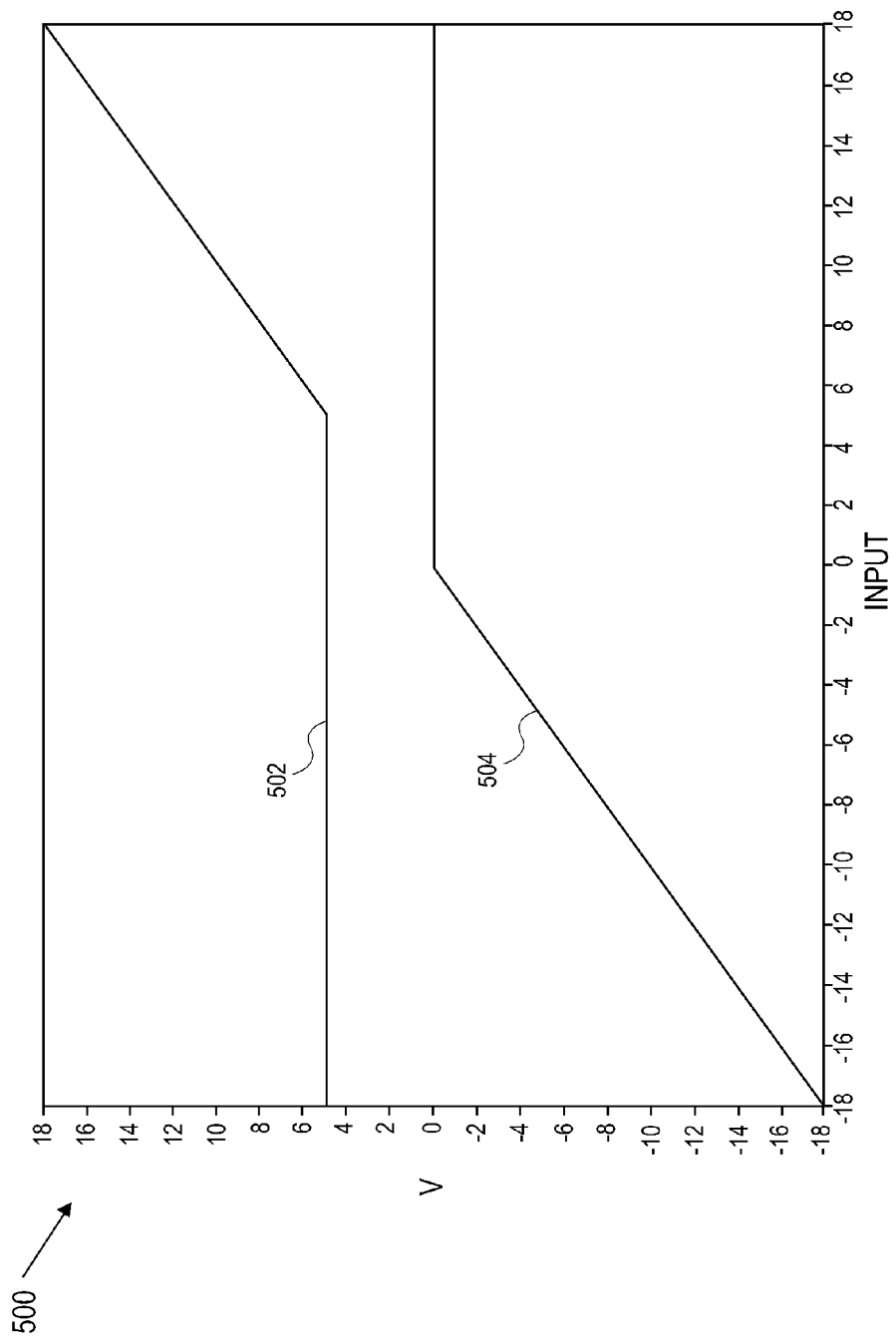
FIG. 5 is a graph illustrating the voltage level of the floating power and the floating ground as the voltage selector input changes.

FIG. 5 is a graph illustrating the voltage levels of the floating power 202 and the floating ground 204, implemented using either of the circuits illustrated in FIGS. 4A and 4B, as the voltage selector input signal 112 changes. The x-axis of the graph 500 represents the voltage of the voltage selector input signal 112 as it varies from −18 volts to 18 volts. Although illustrated as −18 volts to 18 volts, it will be understood that the variation in the voltage of the voltage selector input signal 112 can be greater. The y-axis of the graph 500 represents the resulting voltage levels of the floating power 202 and the floating ground 204.

As illustrated, and as described previously, the voltage of the floating power 202 is roughly equal to the greater of the voltage of the system power high source 106 and the voltage of the voltage selector input signal 112. It will be understood that in some embodiments, the input signal can be dynamically varying, and that the voltage selection circuits described earlier in connection with FIGS. 4A and 4B can dynamically choose one source from the voltage selector input signal 112 and system power high source to make floating powers, and choose one source from the voltage selector input signal 112 and system power low source to make floating grounds. In the illustrated example, the system power high source is at 5 volts. With reference to the line 502, which represents the voltage level of the floating power 202, it can be seen that when the voltage selector input signal 112 is less than 5 volts, the voltage of the floating power is roughly equal to 5 volts (the voltage of the system power high source 106). When the voltage selector input signal 112 exceeds 5 volts, the line 502 (floating power) becomes roughly equal to the voltage selector input signal 112.

Similarly, as discussed previously, the voltage of the floating ground 204 is roughly equal to the lesser of the voltage of the system power low source 108 and the voltage selector input signal 112. In the illustrated example, the system power low source 108 is ground (0 volts). Thus, as illustrated by the line 504, when the voltage selector input signal 112 is less than 0 volts, the line 504 (floating ground) is roughly equal to the voltage selector input signal 112. When the voltage selector input signal 112 exceeds 0 volts, the line 504 (floating ground) is roughly equal to 0 volts.

Figure 6:
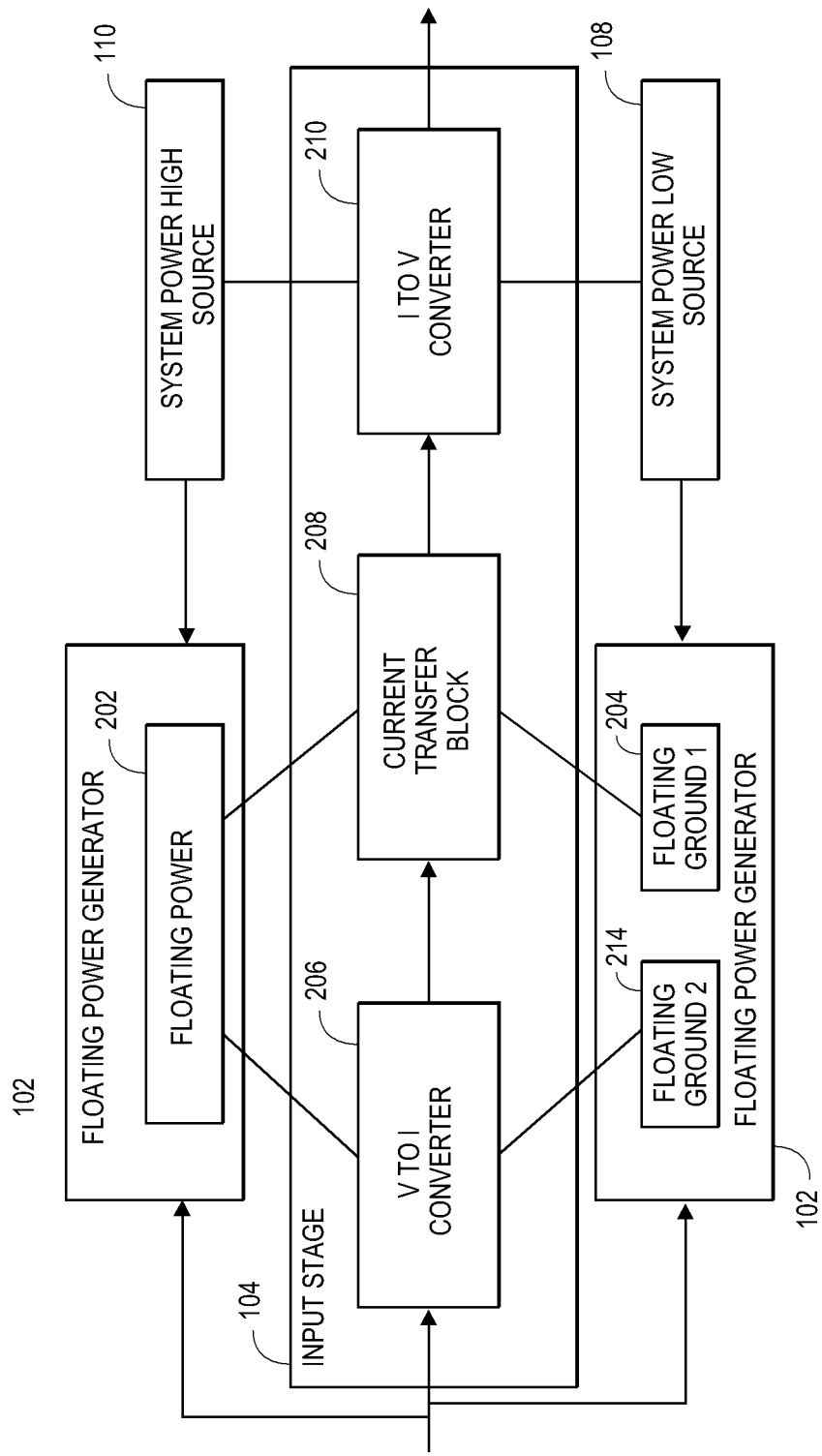
FIG. 6 is a schematic block diagram illustrating an input stage with two floating grounds.

FIG. 6 is a schematic block diagram illustrating another embodiment of the input stage 104 of the system 100. In the illustrated embodiment of FIG. 6, the floating power generator 102 generates a first floating ground 204 and a second floating ground 214. In the illustrated embodiment, the floating power generator 102 can be configured to generate the floating power 202 such that the floating power 202 tracks the voltage selector input signal 112. The first floating ground can be configured to be roughly equal to the lesser of the voltage selector input signal 112 and the system power low source 108, and the second floating ground 214 can be configured to maintain a relatively constant voltage difference from the floating power 202 as the floating power 202 tracks the voltage selector input signal 112.

As illustrated, the voltage-to-current converter 206 can be coupled with the floating power 202 and the second floating ground 214. In this manner, the voltage of the input voltage signals is within the input range of the voltage-to-current converter 206. Further, the current transfer block 208 can be coupled with the floating power 202 and the first floating ground 204. As such, the current transfer block 208 can function as a bridge to convey signals from the voltage-to-current converter 206, whose voltage level may also move with floating power and floating ground, to a current-to-voltage converter 210, or any circuits powered with a system power high source and low source, which are usually fixed. Further, by separating the ground of the voltage-to-current converter 206 from the ground of current transfer block 208, the voltage-to-current converter 206 can be designed with low voltage devices for better performance, lower cost, and more compact chip size. For example, as will be described in greater detail below with reference to FIG. 9, the voltage-to-current converter 206 can be coupled with floating power 202 and the second floating ground 214, and the voltage difference between the second floating ground 214 and the floating power 202 can be less than 5.4 V.

In addition, the current-to-voltage converter 210 can be coupled to the system power high source 106 and the system power low source 108. In this way, the common mode voltage of the output the current-to-voltage converter 210 can be roughly equal to, or compatible with, the voltage of the system. In this embodiment, the second floating ground 214 can increase the input common mode range of the system 100 and enable the use of low voltage devices, thereby improving performance and reducing cost.

Figure 7:
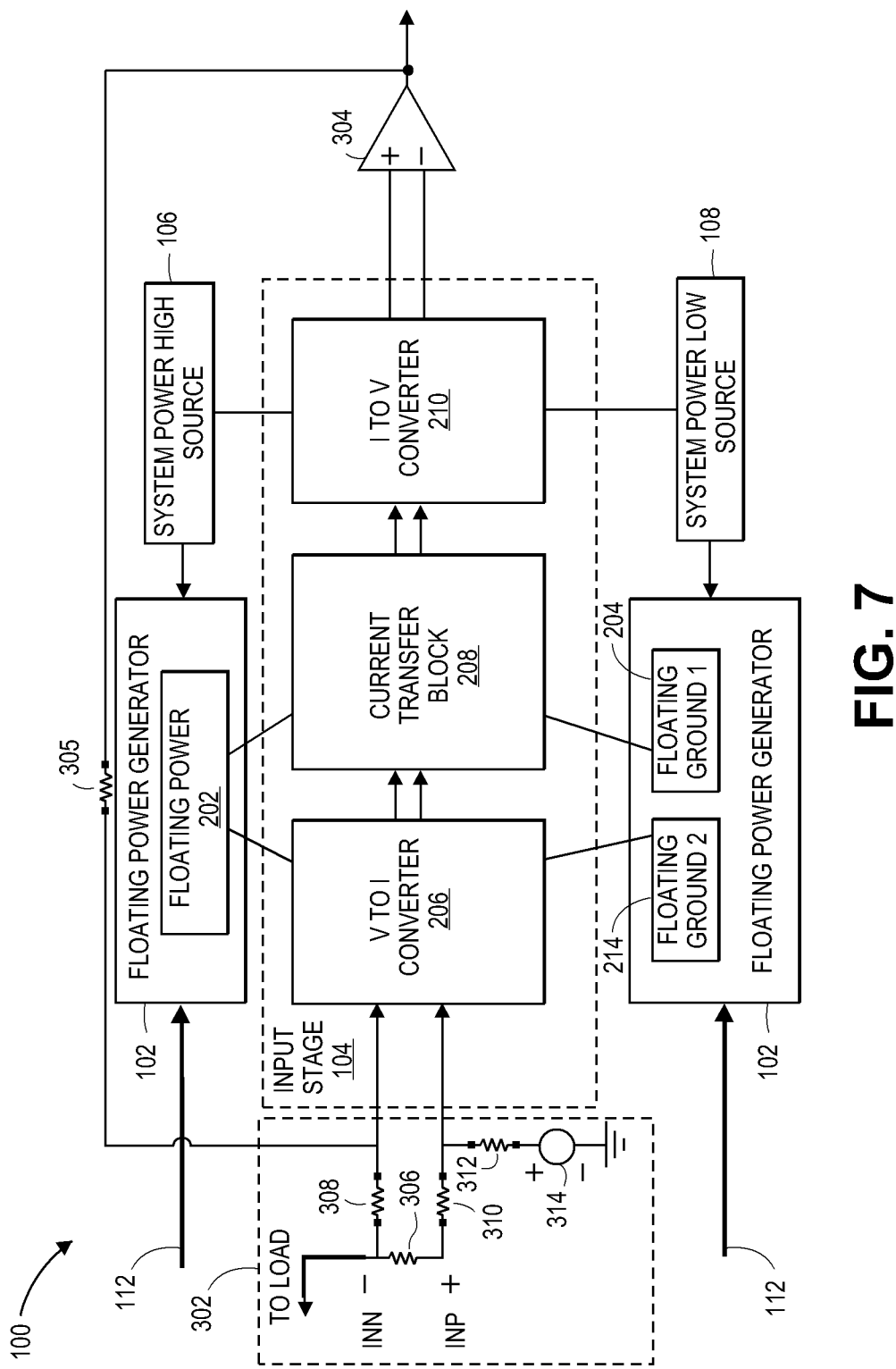
FIG. 7 is a block diagram illustrating an embodiment of a wide common mode difference amplifier circuit with two floating grounds.

FIG. 7 is a block diagram illustrating another embodiment of the wide common mode difference amplifier circuit 300 that includes two floating grounds 204, 214. The embodiment illustrated in FIG. 7 is similar in many respects to the embodiment illustrated in FIG. 3. However, the illustrated embodiment of FIG. 7 includes two floating grounds 204, 214. As described in greater detail above with reference to FIG. 3, the circuit 300 includes input circuitry 302 for receiving the input signal and providing the input signal to the voltage-to-current converter 206 of the input stage 104. In addition, the circuit 300 includes an output amplifier 304 for amplifying the difference between the inverting and non-inverting signals of the input signal received from the input stage 104. As described in greater detail above with reference to FIG. 6, in the illustrated embodiment, the circuit 300 includes two floating grounds 204, 214, which are coupled to the current transfer block 208 and the voltage-to-current converter 206, respectively.

Figure 8:
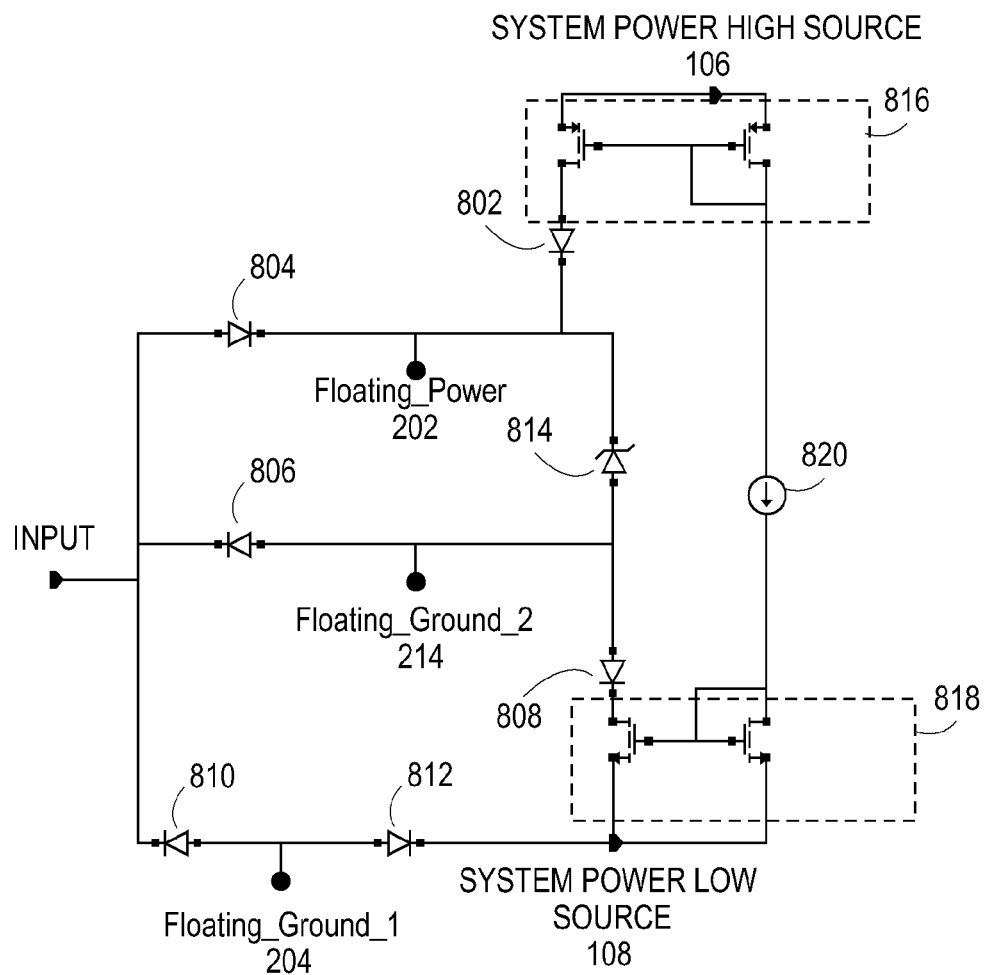
FIG. 8 is a circuit diagram illustrating an embodiment of a floating power generator that can generate two floating grounds.

FIG. 8 is a circuit diagram illustrating an embodiment of the floating power generator 102 that can generate two floating grounds 204, 214, using diodes, clamping diodes, a current source, and one or more MOSFETs. In the illustrated embodiment of FIG. 8, the floating power generator 102 includes diodes 802, 804, 806, 808, 810, 812; clamping diode 814, current mirrors 816, 818; and a current source 820. The diode 802 can be electrically coupled with the output of the current mirror 816 and the floating power 202 (e.g., anode electrically coupled with the current mirror 816 and cathode electrically coupled with the floating power 202), and the diode 804 can be electrically coupled with the voltage selector input signal 112 and the floating power 202 (e.g., anode electrically coupled with the voltage selector input signal 112 and cathode electrically coupled with the floating power 202). In this manner, the floating power 202 can be configured to track the voltage level of the voltage selector input signal 112.

The diode 806 can be electrically coupled with the second floating ground 214 and the voltage selector input signal 112 (e.g., anode electrically coupled with the second floating ground 214 and cathode electrically coupled with the voltage selector input signal 112), and the diode 808 can be electrically coupled with the second floating ground 214 and the output of the second current mirror 818 (e.g., anode electrically coupled with the second floating ground 214 and cathode electrically coupled with the output of the second current mirror 818). The second floating ground 214 can be configured to track the voltage selector input signal 112 and maintain a relatively constant voltage difference from the floating power 202 based on the diodes 806, and 808, and using a clamping diode 814, which in some embodiments can be a Zener diode. The clamping diode 814 can be electrically coupled with the second floating ground 214 and the floating power 202 (e.g., anode electrically coupled with the second floating ground 214 and cathode electrically coupled with the floating power 202). The clamping diode 814 can be configured to regulate the voltage difference between the second floating ground 214 and the floating power 202, and can maintain a more constant voltage difference between the second floating ground 214 and the floating power 202. Although illustrated as a clamping diode, it is to be understood that other regulator circuits can be used to regulate the voltage difference between the second floating ground 214 and the floating power 202.

The diode 810 can be electrically coupled with the first floating ground 204 and the voltage selector input signal 112 (e.g., anode electrically coupled with the first floating ground 204 and cathode electrically coupled with the voltage selector input signal 112), and the diode 812 can be electrically coupled with the first floating ground 204 and the system power low source 108 (e.g., anode electrically coupled with the first floating ground 204 and cathode electrically coupled with the system power low source 108). In this manner, the first floating ground 204 can be configured to be roughly equal the lesser of the voltage selector input signal 112 and the system power low source 108.

The first current mirror 816 can be located near the system power high source 106 and the second current mirror 818 can be located near the system power low source 108. Further, the current source 820 can set a bias current for the first current mirror 816 and the second current mirror 818. It is to be understood that the current mirrors 816, 818 can be implemented using transistors, such as, but not limited to FETS, BJTs, etc.

Figure 9:
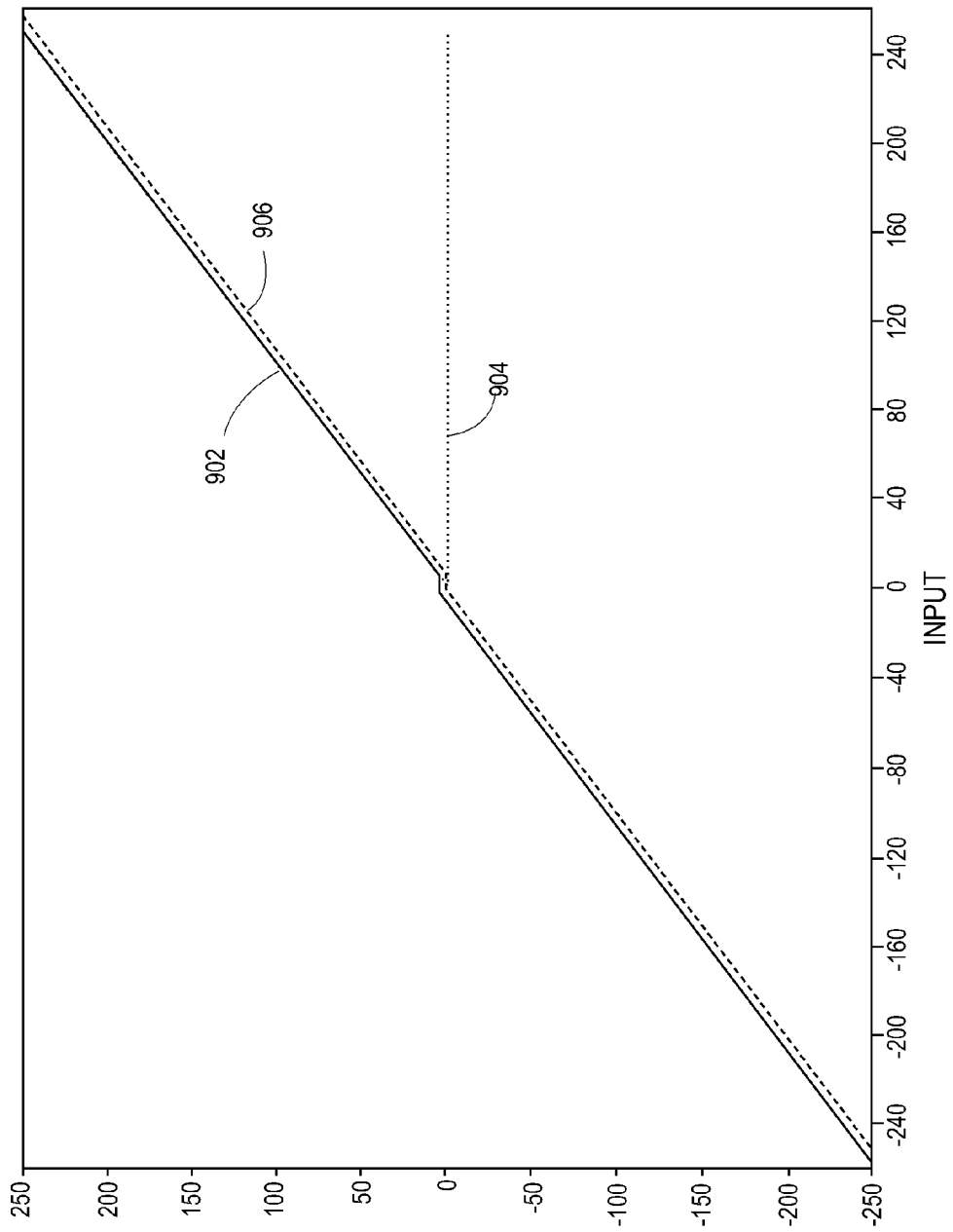
FIG. 9 is a graph illustrating the voltage of the floating power and the two floating grounds based on changes in the voltage selector input.

FIG. 9 is a graph of the voltage levels of the floating power 202, first floating ground 204 and second floating ground 214. The x-axis of the graph 900 represents the voltage levels of the input from −240 volts to 240 volts and the y-axis represents the voltage levels of the first floating power 202, the first floating ground 204, and the second floating ground 214. Lines 902, 904, 906 represent the voltage of the first floating power 202, the first floating ground 204, and the second floating ground 214 as the voltage selector input signal 112 changes, respectively. As discussed previously, in some embodiments, the floating power 202 can vary with the voltage selector input signal 112 (line 902), the first floating ground can be roughly equal to the lesser of the voltage selector input signal 112 and the system power low source, which is 0 volts in this example (line 904), and the second floating ground can track the voltage selector input signal 112 and maintains a relatively constant difference from the floating power 202 (line 906).

Figure 10:
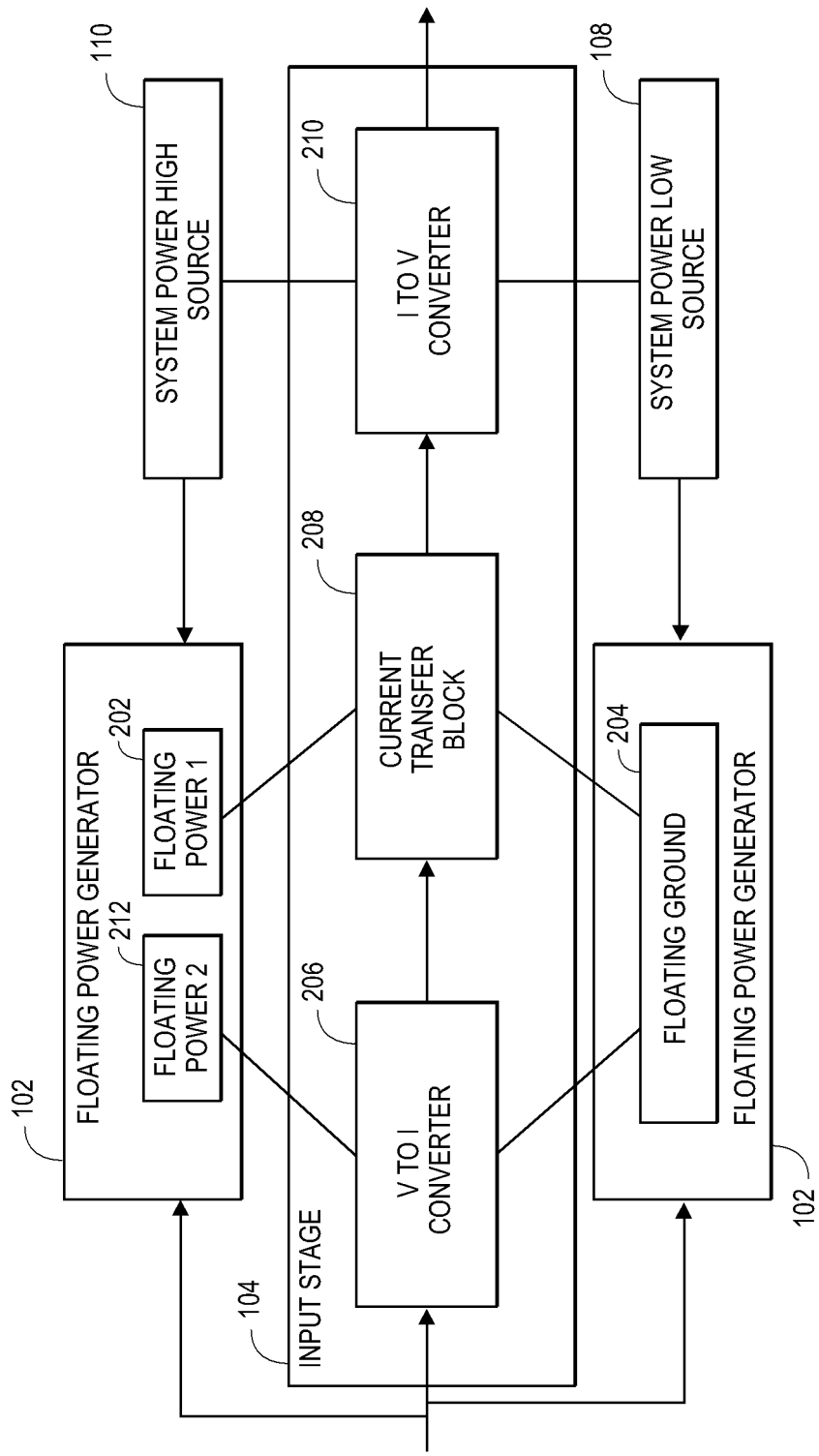
FIG. 10 is a schematic block diagram illustrating an input stage with two floating powers.

FIG. 10 is a schematic block diagram illustrating an embodiment of the input stage 104 of the system 100 with two floating powers. FIG. 10 is similar in many respects to FIGS. 2 and 6. However, in the embodiment illustrated in FIG. 10, the floating power generator 102 generates a first floating power 202 and a second floating power 212. The first floating power 202 can be configured to be roughly equal to the greater of the voltage selector input signal 112 and the system power high source 106. The second floating power 212 can be configured to maintain a more constant voltage difference from the floating ground 204. The floating ground 204 can be configured to track the voltage level of the voltage selector input signal 112.

As illustrated, the voltage-to-current converter 206 can be coupled with the second floating power 212 and the floating ground 204. In this manner, the voltage of the input voltage signals is within the input range of the voltage-to-current converter 206. Further, the current transfer block 208 functions as a bridge to convey signals from the voltage-to-current converter 206, whose voltage level may also move with floating power and floating ground, to a current-to-voltage converter 210, or any circuits powered with a system power high source and low source, which are usually fixed. Further, by separating the power source of the voltage-to-current converter 206 from the power source of current transfer block 208, the voltage-to-current converter 206 can be designed with low voltage devices for better performance, lower cost, and more compact chip size. For example, as will be described in greater detail below with reference to FIG. 13, the voltage-to-current converter 206 can be coupled with the second floating power 212 and the floating ground 204, and the voltage difference between the floating ground 204 and the second floating power 212 can be less than 5.4 V.

In addition, the current-to-voltage converter 210 can be coupled to the system power high source 106 and the system power low source 108. In this way, the common mode voltage of the output the current-to-voltage converter 210 can be compatible with other circuits in the system. In this embodiment, the second floating power 212 can increase the common mode range of the system 100 and enable the use of low voltage devices, thereby improving performance and reducing cost.

Figure 11:
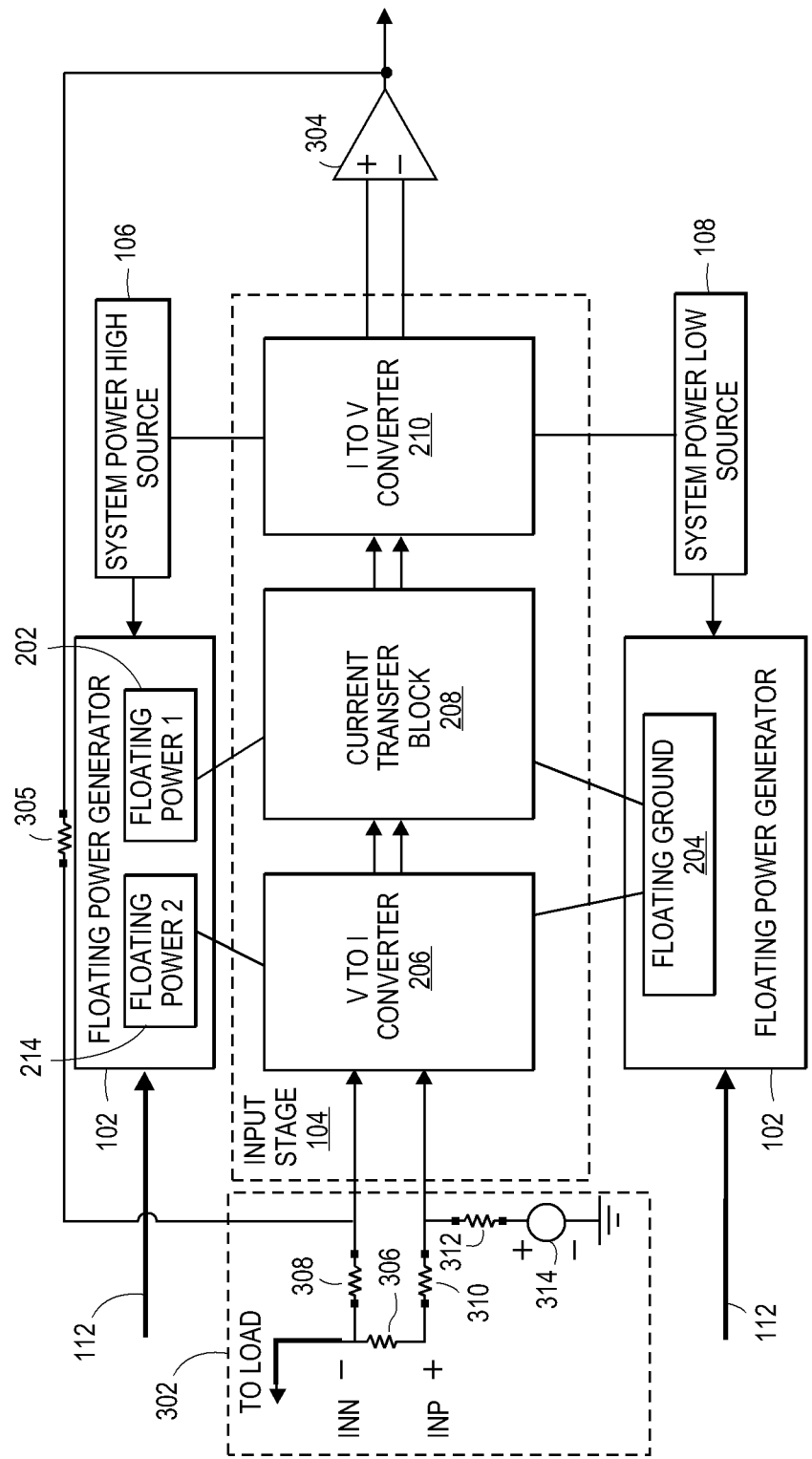
FIG. 11 is a block diagram illustrating an embodiment of a wide common mode difference amplifier circuit with two floating powers.

FIG. 11 is a block diagram illustrating another embodiment of the wide common mode difference amplifier circuit 300 that includes two floating powers 202, 212. The embodiment illustrated in FIG. 11 is similar in many respects to the embodiment illustrated in FIG. 3. However, the illustrated embodiment of FIG. 11 includes two floating powers 202, 212. As described in greater detail above with reference to FIG. 3, the circuit 300 includes input circuitry 302 for receiving the input signal and transmitting the input signal to the voltage-to-current converter 206 of the input stage 104. In addition, the circuit 300 includes an output amplifier 304 for amplifying the difference between the input signal received from the input stage 104. As described in greater detail above with reference to FIG. 10, in the illustrated embodiment, the circuit 300 includes two floating powers 202, 212, which are coupled to the current transfer block 208 and the voltage-to-current converter 206, respectively.

Figure 12:
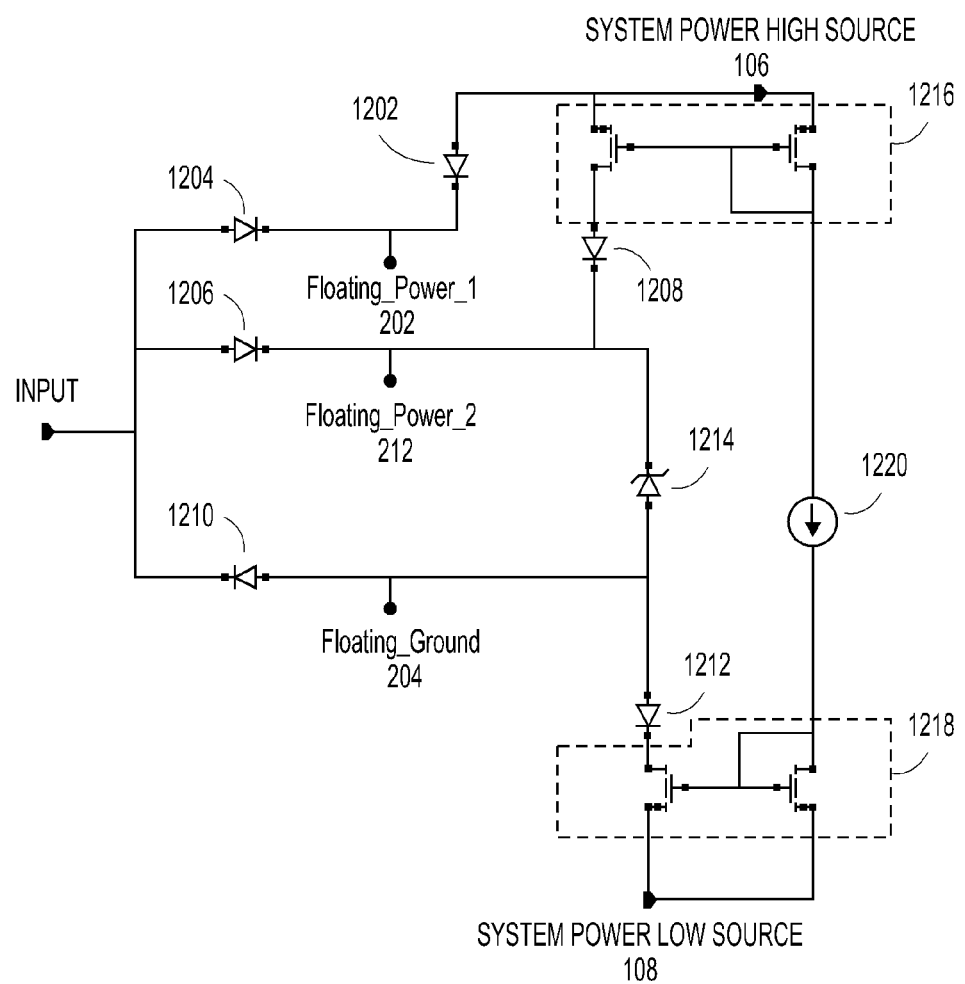
FIG. 12 is a circuit diagram illustrating an embodiment of a floating power generator configures to generate two floating powers.

FIG. 12 is a circuit diagram illustrating an embodiment of the floating power generator 102 that can generate the two floating powers 202, 212, using diodes, clamping diodes, a current source, and one or more MOSFETs. The illustrated embodiment of FIG. 12 can be used to implement the desired voltage levels for the first floating power 202, the second floating power 212, and the floating ground 204, as described previously.

In the illustrated embodiment of FIG. 12, the floating power generator 102 includes diodes 1202, 1204, 1206, 1208, 1210, 1212; clamping diode 1214, current mirrors 1216, 1218; and a current source 1220. The diode 1202 can be electrically coupled with the system power high source 106 and the first floating power 202 (e.g., anode electrically coupled with the system power high source 106 and cathode electrically coupled with the first floating power 202), and the diode 1204 can be electrically coupled with the voltage selector input signal 112 and the first floating power 202 (e.g., anode electrically coupled with the voltage selector input signal 112 and cathode electrically coupled with the first floating power 202). In this manner, the voltage of the first floating power 202 can be configured to be roughly equal to the greater of the voltage of the system power high source 106 and the voltage selector input signal 112.

The diode 1206 can be electrically coupled with the second floating power 212 and the voltage selector input signal 112 (e.g., anode electrically coupled with the second floating power 212 and cathode electrically coupled with the second floating power 212), and the diode 1208 can be electrically coupled with the output of the current mirror 1216 and the second floating power 212 and (e.g., anode electrically coupled with the current mirror 1216 and cathode electrically coupled with the second floating power 212). The clamping diode 1214 can be electrically coupled with the floating ground 204 and the second floating power 212 (e.g., anode electrically coupled with the floating ground 204 and cathode electrically coupled with the second floating power 212) and can function as a limiter to maintain a more constant voltage difference between the floating ground 204 and the second floating power 212. Although illustrated as a clamping diode, it is to be understood that other regulator circuits can be used to regulate the voltage difference between the floating ground 204 and the second floating power 212.

The diode 1210 can be electrically coupled with the floating ground 204 and the voltage selector input signal 112 (e.g., anode electrically coupled with the floating ground 204 and cathode electrically coupled with the voltage selector input signal 112), and the diode 1212 can be electrically coupled with the floating ground 204 and the output of the second current mirror 1218 (e.g., anode electrically coupled with the floating ground 204 and cathode electrically coupled with the second current mirror 1218). In this manner, the floating ground 204 can be configured to track the voltage selector input signal 112.

The first current mirror 1216 can be located near the system power high source 106 and the second current mirror 1218 can be located near the system power low source 108. Further, the current source 1220 can provide bias current for the first current mirror 1216 and the second current mirror 1218. It is to be understood that the current mirrors 1216, 1218 can be implemented using transistors, such as, but not limited to, FETS, BJTs, etc.

Figure 13:
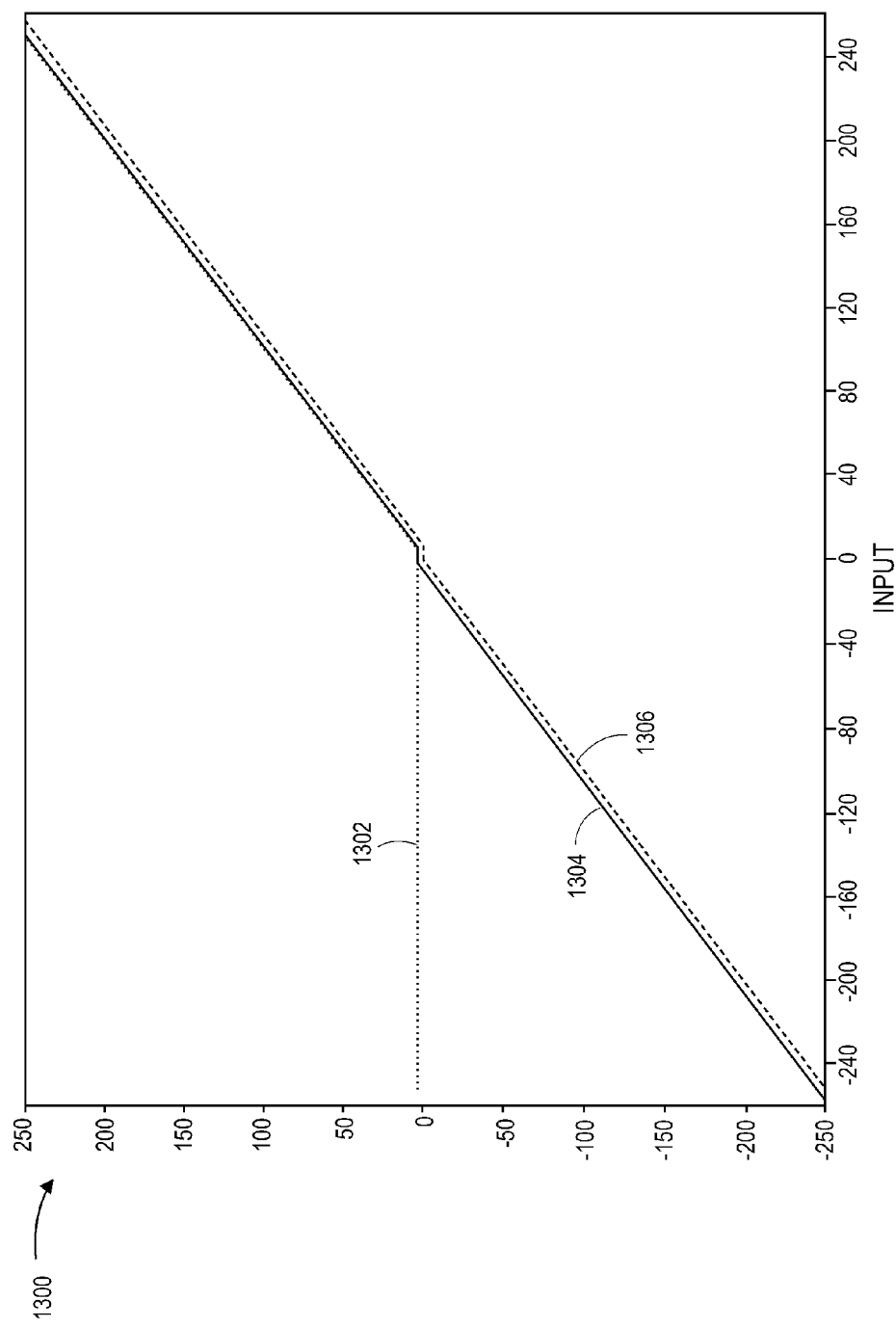
FIG. 13 is a graph illustrating the voltage of two floating powers and a floating ground based on the changes in the voltage selector input.

FIG. 13 is a graph of the voltage levels of the first floating power 202, the second floating power 212, and the first floating ground 204. The x-axis of the graph 1300 represents the voltage levels of the input from −240 volts to 240 volts and the y-axis represents the voltage levels of the first floating power 202, the second floating power 212, and the first floating ground 204. Lines 1302, 1304, 1306 represent the voltage of the first floating power 202, second floating power 212, and the floating ground 204, respectively, as the voltage selector input signal 112 changes.

As discussed previously, the voltage of the floating power 202 is roughly equal to the greater of the voltage selector input signal 112 and the voltage of the system power high source 106. In the illustrated example, the system power high source 106 equals 5 volts. Accordingly, the line 1302 is roughly equal to 5 volts when the voltage selector input signal is less than 5 volts, and is roughly equal to the voltage selector input signal 112 when the voltage selector input signal 112 is greater than 5 volts. Also as discussed, the floating ground 204 tracks the voltage selector input signal 112 (line 1306), and the second floating power 212 tracks the voltage selector input signal 112 and maintains a more constant difference from the floating ground 204 (line 1304).

Figures 14A, 14B:
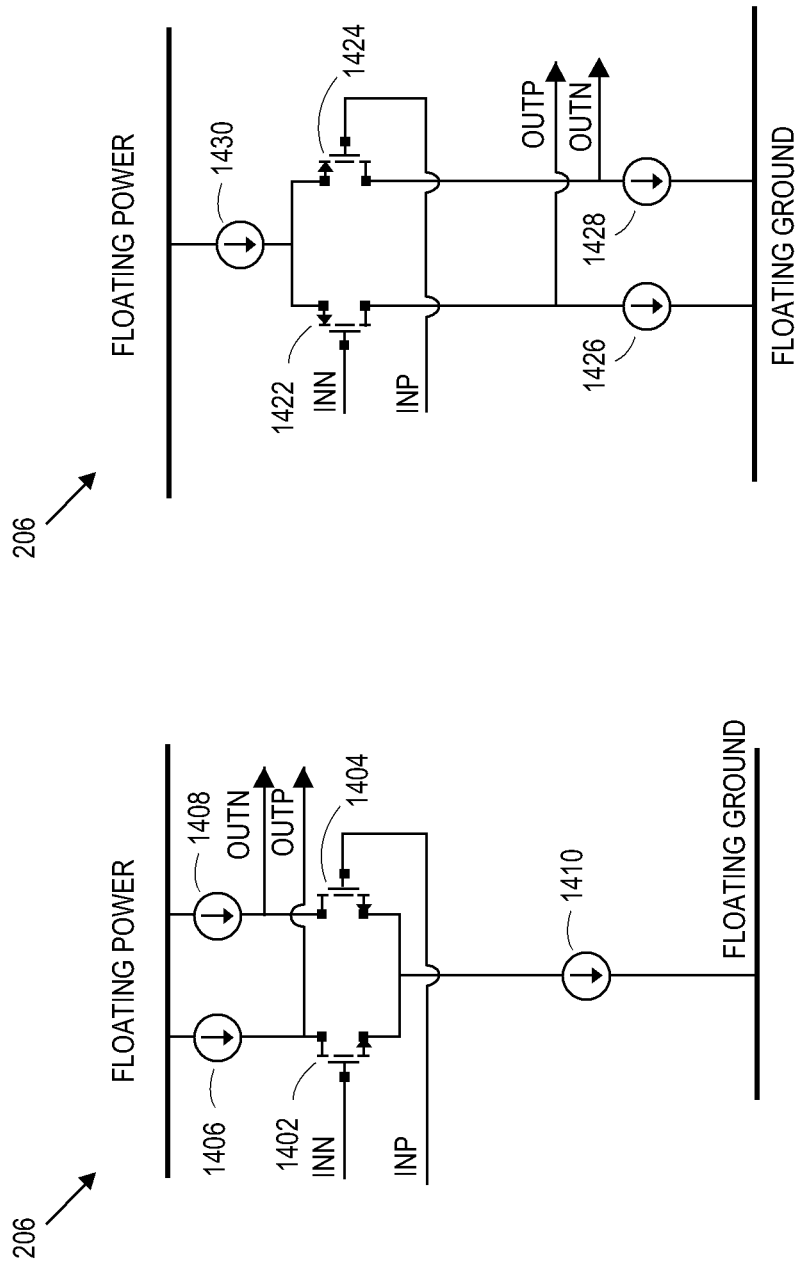
FIGS. 14A, 14B, and 14C are circuit diagrams illustrating embodiments of a voltage-to-current converter.
Figure 14C:
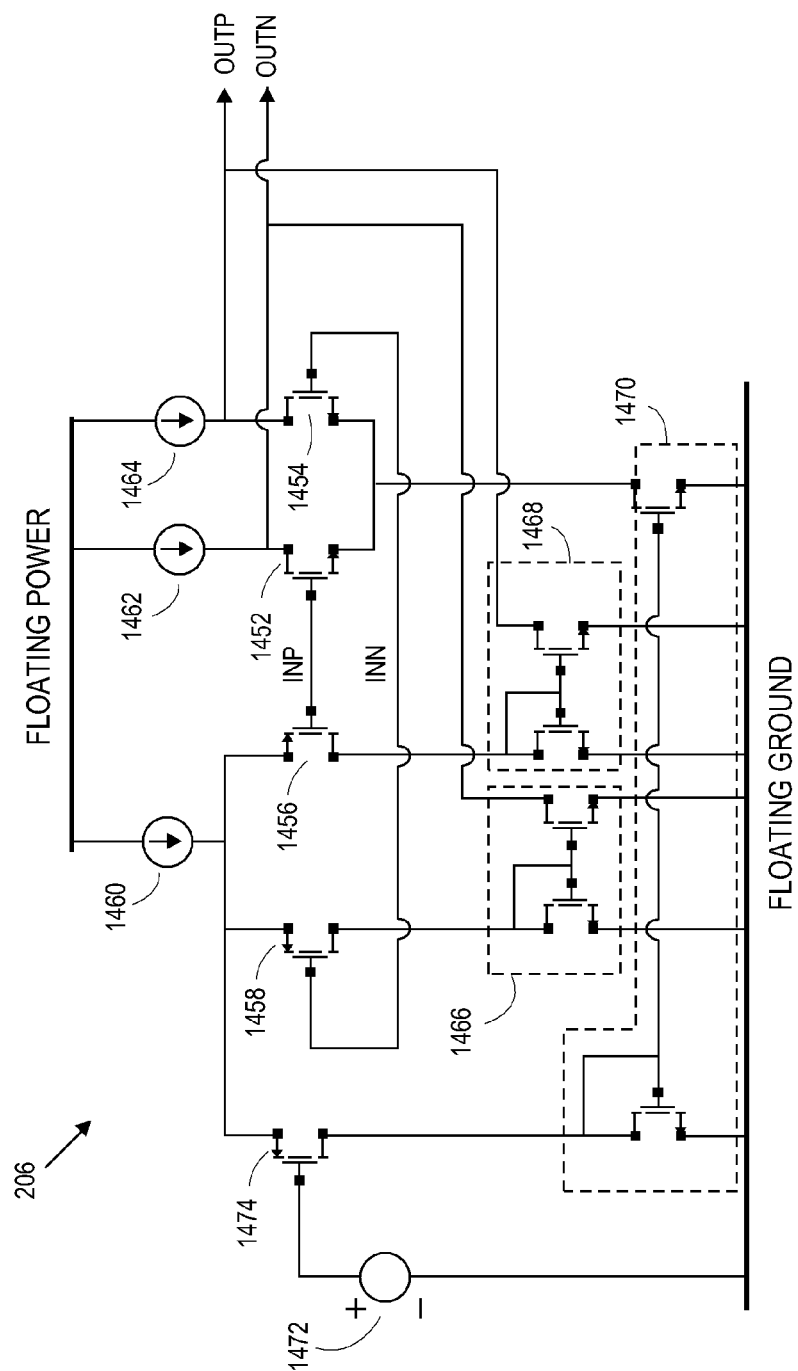

FIGS. 14A-14C are circuit diagrams illustrating embodiments of the voltage-to-current converter 206, referred to in FIGS. 2, 3, 6, 7, 10, 11. Generally speaking, the inverted and non-inverted signals of the input signal INN, INP can be coupled with the transistors (e.g., FETS, BJTs, etc.). Changes in the voltage of the voltage selector input signal 112 can cause corresponding changes in current detected at the transistors. The detected current at the transistors can be used as the output of the voltage-to-current converter 206.

In the illustrated embodiment of FIG. 14A, the inverted and non-inverted signals of the input signal can be coupled with the gates of two separate NMOS transistors 1402, 1404. In addition to the NMOS transistors 1402, 1404, the voltage-to-current converter 206 can include current sources 1406, 1408, 1410. The current sources 1406, 1408 can be coupled with a floating power (first floating power or second floating power) and the drain of the NMOS transistors 1402, 1404, respectively. The current source 1410 can be coupled with the sources of both NMOS transistors 1402, 1404 and a floating ground (first floating ground or second floating ground).

As the differential input signal changes, a corresponding change in current can be detected on the drain of each of the NMOS transistors. The current level on the drain of each of the NMOS transistors can be used as the output of the voltage-to-current converter 206. Thus, based on the configuration of the NMOS transistors 1402, 1404 and the current sources 1406, 1408, 1410, the inverted and non-inverted signals of the input signal are converted to current signals. It will be understood that alternative components can be used in place of the NMOS transistors. For example, other FETs, MOSFETS, such as PMOS transistors, BJTs, and/or other transistors can be used. In addition, it will be understood that the inputs INP, INN can be switched with each other, as well as the outputs OUTP, OUTN.

FIG. 14B illustrates another embodiment of the voltage-to-current converter 206 using PMOS transistors 1422, 1424, and current sources 1426, 1428, 1430. The current sources 1426, 1428 can be coupled with the floating power (first floating power or second floating power) and the drains of the PMOS transistors 1422, 1424, respectively. The current source 1430 can be coupled with the sources of both PMOS transistors 1422, 1424 and a floating ground (first floating ground or second floating ground).

Similar to the embodiment described with reference to FIG. 14A, the incoming inverted and non-inverted signals of the input signal can be coupled with the gate of the PMOS transistors 1422, 1424. As the differential input signal changes, a corresponding change in current can be detected at the drain of each of the PMOS transistors 1422, 1424. The current level on the drain of each of the PMOS transistors 1422, 1424 can be used as the output of the voltage-to-current converter 206. Accordingly, based on the configuration of the PMOS transistors 1422, 1424 and the current sources 1426, 1428, 1430, the inverted and non-inverted signals of the input signal are converted to current signals. It will be understood that alternative components can be used in place of the PMOS transistors. For example other FETs, MOSFETS, such as NMOS transistors, BJTs, and/or other transistors can be used. In addition, it will be understood that the inputs INP, INN can be switched with each other, as well as the outputs OUTP, OUTN.

FIG. 14C illustrates an embodiment of the voltage-to-current converter 206 that is a hybrid of the embodiments illustrated in FIGS. 14A and 14B. The embodiment illustrated in FIG. 14C has a rail to rail input common mode range, so that the inverted and non-inverted signals of the input signal can be anywhere between or even beyond the floating power(s) and floating ground(s). As illustrated, the voltage-to-current converter 206 can include the NMOS transistors 1452, 1454, the PMOS transistors 1456, 1458, the current sources 1460, 1462, 1464, the current mirrors 1466, 1468, 1470, a voltage reference 1472 and a PMOS transistor 1474. As the differential input signal changes, the current at the output can also change.

In an embodiment, the current source 1460 can be coupled with a floating power (first floating power or second floating power) and the source of the PMOS transistors 1458, 1456. The current sources 1462, 1464 can be coupled with the floating power (first floating power or second floating power) and the drain of the NMOS transistors 1452, 1454. The current mirrors 1466, 1468, 1470 can be coupled with the floating ground (first floating ground or second floating ground). Further, the input of the current mirror 1466 can be couple with the drain of the PMOS transistor 1450. Similarly, the input of the current mirror 1468 can be coupled with the drain of the PMOS transistor 1456. The sources of the NMOS transistors 1452, 1454 can be coupled with the output of the current mirror 1470. The output of the voltage-to-current converter can be coupled with the drain of the NMOS transistors 1452, 1454 and with the output of the current mirrors 1466, 1468. In addition, it will be understood that the inputs INP, INN can be switched with each other, as well as the outputs OUTP, OUTN.

The FIGS. 15A-15D are circuit diagrams illustrating embodiments of a current transfer block 208, referred to in FIGS. 2, 3, 6, 7, 10, 11. As illustrated, the current transfer block 208 can be implemented using one or more switches or transistors, such as, but not limited to PMOS transistors, NMOS transistors, FETs, BJTs, etc. In addition, bias voltages can be used to ensure that the transistors operate in the appropriate mode. As illustrated, the components of the current transfer block can be coupled with a floating power (first floating power or second floating power) and a floating ground (first floating around or second floating around). As mentioned previously, the current transfer block 208 can be used as a buffer, or bridge, between voltage-to-current converter 206 and the current-to-voltage converter 210.

Figure 15A:
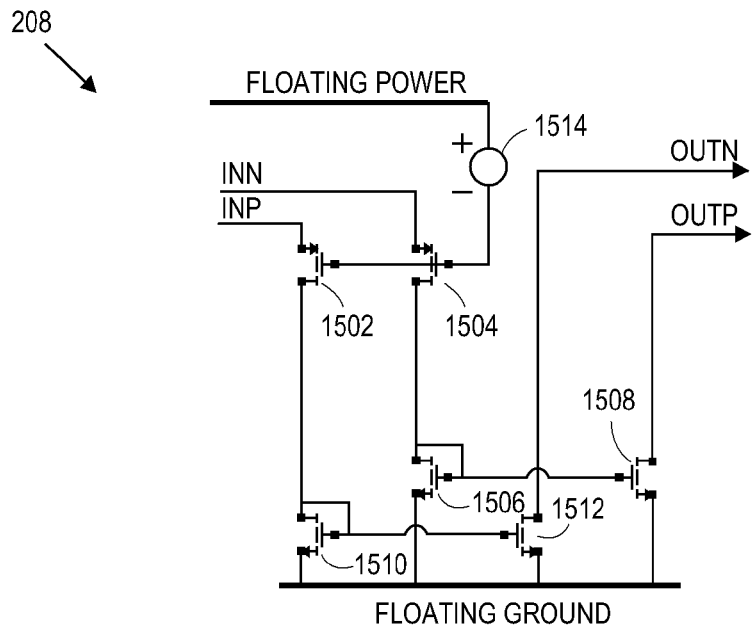
FIGS. 15A, 15B, 15C, and 15D are circuit diagrams illustrating embodiments of a current transfer block.
Figure 15B:
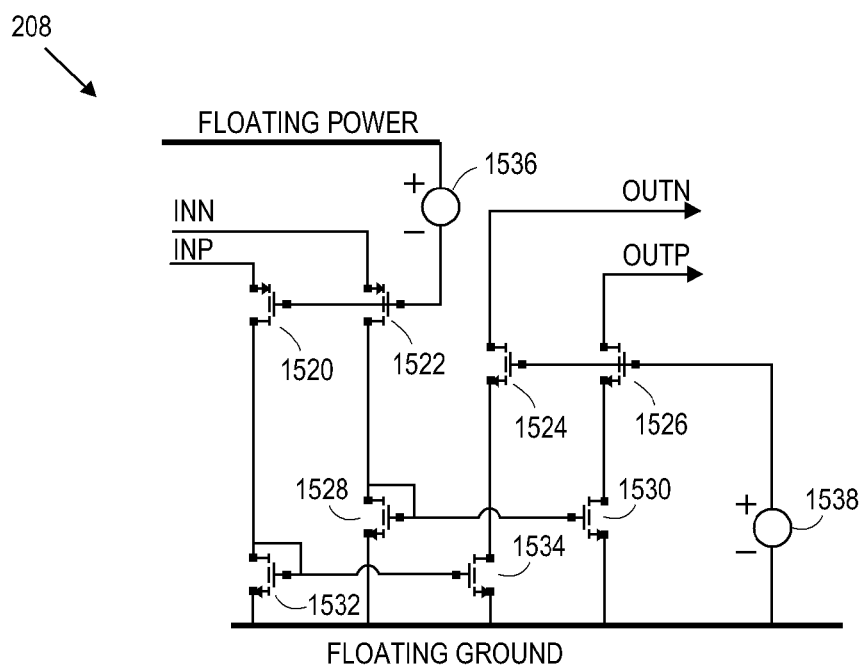
Figure 15C:
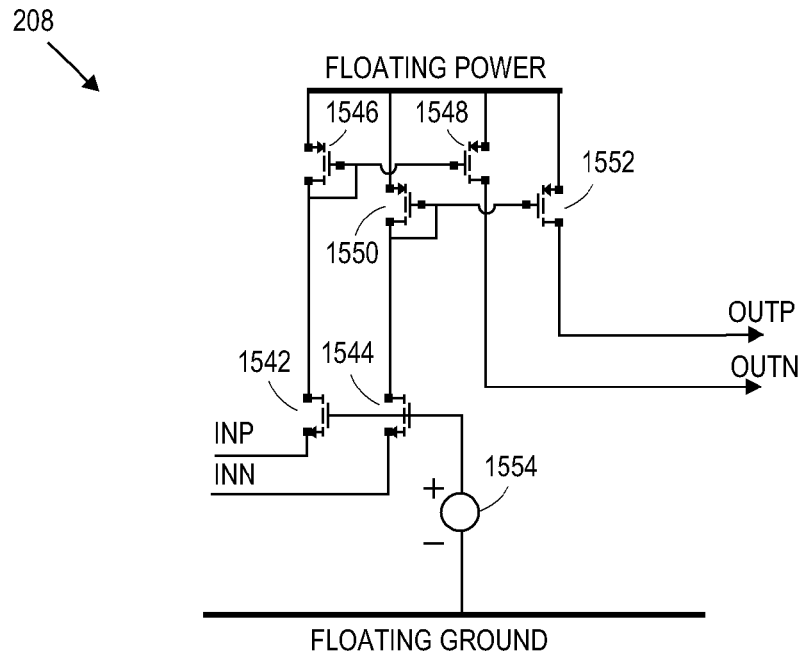
Figure 15D:
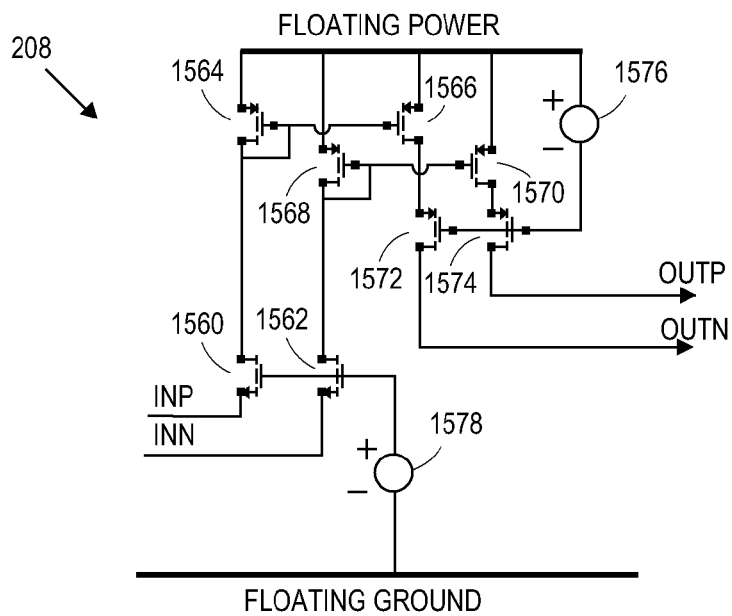

FIG. 15A illustrates an embodiment of the current transfer block 208 implemented using PMOS transistors 1502, 1504, NMOS transistors 1506, 1508, 1510, 1512, and a bias voltage 1514. The NMOS transistors 1506, 1508 and 1510, 1512 can be configured as current mirrors, respectively. FIG. 15B illustrates an embodiment of the current transfer block 208 implemented using PMOS transistors 1520, 1522, NMOS transistors 1524, 1526, 1528, 1530, 1532, 1534, and voltage biases 1536, 1538. The NMOS transistors 1528, 1530 and 1532, 1534 can be configured as current mirrors, respectively. FIG. 15C illustrates an embodiment of the current transfer block 208 implemented using NMOS transistors 1542, 1544, PMOS transistors 1546, 1548, 1550, 1552, and a bias voltage 1554. The PMOS transistors 1546, 1548 and 1550, 1552 can be configured as current mirrors, respectively. FIG. 15D illustrates an embodiments of the current transfer block 208 implemented using NMOS transistors 1560, 1562, PMOS transistors 1564, 1566, 1568, 1570, 1572, 1574, and voltage biases 1576, 1578. The PMOS transistors 1568, 1570 and 1572, 1574 can be configured as current mirrors, respectively. In addition, as mentioned previously, it will be understood that the inputs INP, INN can be switched with each other, as well as the outputs OUTP, OUTN.

FIGS. 16A-16D are circuit diagrams illustrating embodiments of the current-to-voltage converter 210, referred to in FIGS. 2, 3, 6, 7, 10, 11. As illustrated, the current-to-voltage converter 210 can be implemented using one or more transistors, such as PMOS transistors, NMOS transistors, FETS, BJTs, etc. In addition, the current-to-voltage converter can use one or more current sources and voltage sources. In some embodiments, the current-to-voltage converter 210 can be coupled with the system power high source 106 and the system power low source 108. As mentioned previously, the current-to-voltage converter 210 can be used to convert the current signals from the current transfer block 208 into voltage signals to be used by the circuit. Based on the configuration of the current-to-voltage converter 210, the variations in current at the input of the current-to-voltage converter 210 can result in changes to the voltage levels at the output. In this manner, the current-to-voltage converter can convert a current signal at the input to a voltage signal at the output.

FIGS. 16A and 16B illustrate embodiments of the current-to-voltage converter 210 using PMOS transistors 1602, 1604, current sources, and a voltage bias 1606. The embodiment illustrated FIG. 16A includes two current sources 1608, 1610 coupled to the drain of the PMOS transistors 1602, 1604, while the embodiment illustrated FIG. 16B includes four current sources 1608, 1610, 1612, 1614, coupled to the source and drain of the PMOS transistors. In addition, as shown, it will be understood that the inputs INP, INN can be switched with each other, as well as the outputs OUTP, OUTN.

FIGS. 16C and 16D illustrate embodiments of the current-to-voltage converter using NMOS transistors 1620, 1622, current sources, and a voltage bias 1624. The embodiment illustrated FIG. 16C includes two current sources 1626, 1628 coupled to the drain of the NMOS transistors 1620, 1622, while the embodiment illustrated FIG. 16D includes four current sources 1624, 1626, 1628, 1630, coupled to the source and drain of the NMOS transistors. It will be understood that various alternative embodiments can be used to implement the current-to-voltage converter 210 using a variety of different configurations. In addition, as shown, it will be understood that the inputs INP, INN can be switched with each other, as well as the outputs OUTP, OUTN.

A skilled artisan will appreciate that the configurations and principles of the embodiments can be adapted for any electronic system. The circuits employing the above described configurations can be implemented into various electronic devices or integrated circuits. Examples of the electronic devices can include, but are not limited to, consumer electronic products, parts of the consumer electronic products, electronic test equipment, etc. Further, the electronic device can include unfinished products. Furthermore, the various topologies, configurations and embodiments described above may be implemented discretely or integrated on a chip without departing from the spirit and scope of the description.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this disclosure has been described in terms of certain embodiments, other embodiments that are apparent to those of ordinary skill in the art, including embodiments that do not provide all of the features and advantages set forth herein, are also within the scope of the disclosure. Moreover, the various embodiments described above can be combined to provide further embodiments. In addition, certain features shown in the context of one embodiment can be incorporated into other embodiments as well. Accordingly, the scope of the disclosure is defined only by reference to the appended claims.

What is claimed is:

1. An apparatus, comprising:
   a voltage selector circuit configured to receive a first supply voltage and a voltage selector input signal and further configured to generate a first internal rail voltage based on the lesser of the first supply voltage and the voltage selector input signal, wherein the voltage selector input signal comprises at least one of a non-inverted signal and an inverted signal of an input signal; and an input amplifier circuit configured to receive the input signal and output a voltage level shifted signal of the input signal based at least on the first supply voltage, at least a portion of the input amplifier circuit being coupled to the first internal rail voltage.

2. The apparatus of claim 1, wherein the voltage selector circuit is further configured to receive a second supply voltage and generate a second internal rail voltage based on the greater of the second supply voltage and the voltage selector input signal, and at least a portion of the input amplifier circuit is coupled to the second internal rail voltage.

3. The apparatus of claim 1, wherein the first supply voltage is ground and the second supply voltage is a DC power supply.

4. The apparatus of claim 1, wherein the voltage selector input signal comprises only one of the inverted signal and the non-inverted signal of the input signal.

5. The apparatus of claim 1, wherein the voltage selector input signal comprises a combination of the inverted signal and the non-inverted signal of the input signal.

6. The apparatus of claim 4, wherein the voltage selector input signal is a common mode voltage of the input signal.

7. The apparatus of claim 2, wherein the input amplifier circuit comprises:
- a voltage-to-current converter configured to receive the input signal and convert the input signal to one or more current signals, wherein the voltage-to-current converter is coupled to the first internal rail voltage and the second internal rail voltage;
- a current transfer block comprising one or more current mirrors and configured to receive the one or more current signals from the voltage-to-current converter, wherein the current transfer block is coupled to the first internal rail voltage and the second internal rail voltage; and
- a current-to-voltage converter configured to receive the one or more current signals from the current transfer block and convert the one or more current signals to a second signal different from the input signal, wherein the current-to-voltage converter is coupled to the first supply voltage and the second supply ground.

8. The apparatus of claim 2, wherein the voltage selector circuit comprises:
- a first diode electrically coupled with the first internal rail voltage and the voltage selector input signal;
- a second diode electrically coupled with the first internal rail voltage and the first supply voltage;
- a third diode electrically coupled with the second supply voltage and the second internal rail voltage; and
- a fourth diode electrically coupled with the voltage selector input signal and the second internal rail voltage.

9. The apparatus of claim 2, wherein the voltage selector circuit comprises:
- a first comparator that compares a voltage level of the voltage selector input signal with a voltage level of the first supply voltage; and
- a second comparator that compares the voltage level of the voltage selector input signal with a voltage level of the second supply voltage.

10. The apparatus of claim 1, wherein the voltage selector circuit is further configured to receive a second supply voltage and generate a second internal rail voltage and a third internal rail voltage.

11. The apparatus of claim 10, wherein the second internal rail voltage and the third internal rail voltage are based on a voltage level of the voltage selector input signal, wherein the third internal rail voltage maintains a relatively constant voltage difference from the second internal rail voltage, wherein at least a first portion of the input amplifier circuit is coupled to the second internal rail voltage and the third internal rail voltage.

12. The apparatus of claim 10, wherein the input amplifier circuit comprises:
- a voltage-to-current converter configured to receive the differential signal and convert the differential signal to one or more current signals, wherein the voltage-to-current converter is coupled to the second internal rail voltage and the third internal rail voltage;
- a current transfer block comprising one or more current mirrors and configured to receive the one or more current signals from the voltage-to-current converter, wherein the current transfer block is electrically coupled to the first internal rail voltage and the second internal rail voltage; and
- a current-to-voltage converter configured to receive the one or more current signals from the current transfer block and convert the one or more current signals to a second differential signal, wherein the current-to-voltage converter is coupled to the first supply voltage and the second supply voltage.

13. The apparatus of claim 10, wherein the voltage selector circuit comprises:
- a first diode electrically coupled with the first internal rail voltage and the voltage selector input signal;
- a second diode electrically coupled with the first internal rail voltage and the first supply voltage;
- a third diode electrically coupled with the second supply voltage and the second internal rail voltage;
- a fourth diode electrically coupled with the voltage selector input signal and the second internal rail voltage;
- a fifth diode electrically coupled with the third internal rail voltage and the voltage selector input signal;
- a sixth diode electrically coupled with the third internal rail voltage and the first supply voltage; and
- a clamping diode electrically coupled with the third internal rail voltage and the second internal rail voltage.

14. The apparatus of claim 1, further comprising an output amplifier coupled to the input amplifier circuit and configured to receive the voltage level shifted signal and output an output voltage.

15. A method of providing power to an input stage, the method comprising
- receiving a first supply voltage;
- receiving a voltage selector input signal, wherein the voltage selector input signal comprises at least one of a non-inverted signal and an inverted signal of a differential signal; and
- dynamically selecting the lesser of the first supply voltage and a voltage level of the voltage selector input signal as an internal rail voltage for an input stage of an operational amplifier circuit.

16. The method of claim 15, further comprising:
- receiving a second supply voltage; and
- dynamically selecting the greater of the second supply voltage and the voltage level of the voltage selector input signal as a second internal rail voltage for the input stage of the operational amplifier circuit.

17. An apparatus, comprising:
- a voltage selector circuit configured to receive a supply voltage and a voltage selector input signal and further configured to generate an internal rail voltage based on the greater of the supply voltage and the voltage selector input signal, wherein the voltage selector input signal comprises only one of a non-inverted signal and an inverted signal of a differential signal; and an input amplifier circuit having inputs configured to receive the differential signal and outputs coupled to inputs of an output amplifier producing an output voltage, at least a portion of the input amplifier circuit being coupled to the internal rail voltage.

18. The apparatus of claim 17, wherein the supply voltage is a second supply voltage;

the internal rail voltage is a second internal rail voltage;

the voltage selector circuit is further configured to receive a first supply voltage, and is further configured to generate a first internal rail voltage based on the lesser of the first supply voltage and the voltage selector input signal; and at least a portion of the input amplifier circuit is coupled to the first internal rail voltage.

19. The apparatus of claim 17, wherein the voltage selector input signal comprises the greater of the non-inverted signal and the inverted signal of the differential signal.

20. The apparatus of claim 17, wherein the voltage selector input signal comprises the lesser of the non-inverted signal and the inverted signal of the differential signal.

21. The apparatus of claim 17, wherein the supply voltage is a second supply voltage;

the internal rail voltage is a second internal rail voltage; and the voltage selector circuit is further configured to receive a first supply voltage, and is further configured to generate a first internal rail voltage and a third internal rail voltage.

22. The apparatus of claim 21, wherein the first internal rail voltage and the third internal rail voltage are based on a voltage level of the voltage selector input signal, wherein the third internal rail voltage maintains a relatively constant voltage difference from the first internal rail voltage, wherein at least a first portion of the input amplifier circuit is coupled to the second internal rail voltage and the third internal rail voltage.

23. The apparatus of claim 21, wherein the input amplifier circuit comprises:

a voltage-to-current converter configured to receive the differential signal and convert the differential signal to one or more current signals, wherein the voltage-to-current converter is coupled to the first internal rail voltage and the third internal rail voltage;

a current transfer block comprising one or more current mirrors and configured to receive the one or more current signals from the voltage-to-current converter, wherein the current transfer block is coupled to the first internal rail voltage and the second internal rail voltage; and a current-to-voltage converter configured to receive the one or more current signals from the current transfer block and convert the one or more current signals to a second differential signal, wherein the current-to-voltage converter is coupled to the first supply voltage and the second supply voltage.

24. The apparatus of claim 21, wherein the voltage selector circuit comprises:

a first diode electrically coupled with the first internal rail voltage and the first supply voltage;

a second diode electrically coupled with the first internal rail voltage and the voltage selector input signal;

a third diode electrically coupled with the second supply voltage and the second internal rail voltage;

a fourth diode electrically coupled with voltage selector input signal and the second internal rail voltage;

a fifth diode electrically coupled with the second supply voltage and the third internal rail voltage;

a sixth diode electrically coupled with voltage selector input signal and the third internal rail voltage; and a clamping diode electrically coupled with the first internal rail voltage and the third internal rail voltage.

25. A method of providing power to an input stage, the method comprising receiving a supply voltage;

receiving a voltage selector input signal, wherein the voltage selector input signal comprises only one of a non-inverted signal and an inverted signal of a differential signal; and dynamically selecting the greater of the supply voltage and a voltage level of the voltage selector input signal as an internal rail voltage for an input stage of an operational amplifier circuit.

26. The method of claim 25, wherein the supply voltage is a second supply voltage, the internal rail voltage is a second internal rail voltage, and the method further comprises:

receiving a first supply voltage; and dynamically selecting the lesser of the first supply voltage and a voltage level of the voltage selector input signal as a first internal rail voltage for the input stage of the operational amplifier circuit.

* * * * *

UNITED STATES PATENT AND TRADEMARK OFFICE
CERTIFICATE OF CORRECTION

| | | |
|---|---|---|
| PATENT NO. | : 8,902,005 B2 | Page 1 of 1 |
| APPLICATION NO. | : 13/626512 | |
| DATED | : December 2, 2014 | |
| INVENTOR(S) | : Quan Wan | |

It is certified that error appears in the above-identified patent and that said Letters Patent is hereby corrected as shown below:

On the Title Page, (item 54, Title) at line 2, and in the Specification, in column 1 at line 2, After "DIFFERENCE" insert --AMPLIFIER--.

Signed and Sealed this
Eighteenth Day of August, 2015

Michelle K. Lee
*Director of the United States Patent and Trademark Office*